United States Patent
Shih et al.

(10) Patent No.: US 11,086,222 B2
(45) Date of Patent: Aug. 10, 2021

(54) METHOD OF MANUFACTURING SEMICONDUCTOR STRUCTURE

(71) Applicant: NANYA TECHNOLOGY CORPORATION, New Taipei (TW)

(72) Inventors: Shing-Yih Shih, New Taipei (TW); Yu-Mei Ni, New Taipei (TW); Shih-Yi Liu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 209 days.

(21) Appl. No.: 16/244,885

(22) Filed: Jan. 10, 2019

(65) Prior Publication Data
US 2020/0168457 A1    May 28, 2020

Related U.S. Application Data

(60) Provisional application No. 62/770,918, filed on Nov. 23, 2018.

(51) Int. Cl.
*G03F 7/20* (2006.01)
*H01L 21/033* (2006.01)
*G03F 1/38* (2012.01)

(52) U.S. Cl.
CPC .............. *G03F 7/2002* (2013.01); *G03F 1/38* (2013.01); *G03F 7/2026* (2013.01); *H01L 21/0335* (2013.01); *H01L 21/0337* (2013.01)

(58) Field of Classification Search
None
See application file for complete search history.

(56) References Cited

U.S. PATENT DOCUMENTS 6,524,876 B1 * 2/2003 Baek .................. H01L 29/4908
                                                            438/48

FOREIGN PATENT DOCUMENTS

TW        200848919        12/2008
TW        201802573 A       1/2018

OTHER PUBLICATIONS

English translation of TW 200848919 using Google Patents (retrieved Jan. 20, 2021). (Year: 2008).*

* cited by examiner

*Primary Examiner* — Kathleen Duda
(74) *Attorney, Agent, or Firm* — Muncy, Geissler, Olds & Lowe, P.C.

(57) ABSTRACT

A method of manufacturing a semiconductor structure includes providing a substrate and a photoresist over the substrate; placing a mask over the photoresist; exposing the photoresist to a predetermined electromagnetic radiation through the mask; and removing at least a portion of the photoresist exposed to the predetermined electromagnetic radiation. The mask includes a first portion configured to totally allow the predetermined electromagnetic radiation passing through, a second portion configured to partially allow the predetermined electromagnetic radiation passing through, and a third portion configured to block the predetermined electromagnetic radiation, the second portion is disposed between the first portion and the third portion.

17 Claims, 25 Drawing Sheets

METHOD OF MANUFACTURING SEMICONDUCTOR STRUCTURE

PRIORITY CLAIM AND CROSS-REFERENCE

This application claims the priority benefit of U.S. provisional application Ser. No. 62/770,918 filed on Nov. 23, 2018. The entirety of the above-mentioned patent application is hereby incorporated by reference herein and made a part of this specification.

TECHNICAL FIELD

The present disclosure relates to a method of manufacturing a semiconductor structure, and particularly relates to a method of patterning a photoresist disposed over a substrate. Further, the present disclosure relates to a tool for manufacturing a semiconductor structure, and particularly relates to a mask for photolithography of a substrate. The mask includes several portions having different transmittances of a predetermined electromagnetic radiation.

DISCUSSION OF THE BACKGROUND

Semiconductor devices are essential for many modern applications. With the advancement of electronic technology, semiconductor devices are becoming smaller in size while having greater functionality and greater amounts of integrated circuitry. Numerous manufacturing steps are implemented in the manufacture of such small semiconductor devices.

During the manufacturing of the semiconductor device, a substrate is provided and several circuitry patterns are formed over the substrate by photolithography. During the photolithography process, a predetermined electromagnetic radiation is radiated toward the substrate through a mask to pattern a photoresist disposed over the substrate. However, an increase in a complexity of the semiconductor device may also increase manufacturing time and involve more tooling for manufacturing the semiconductor device.

As such, there are many challenges for modifying methods of manufacturing the semiconductor device and manufacturing tools for fabricating the semiconductor device.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of manufacturing a semiconductor structure, wherein the method comprises steps of providing a substrate and a photoresist over the substrate; placing a mask over the photoresist; exposing the photoresist to a predetermined electromagnetic radiation through the mask; and removing at least a portion of the photoresist exposed to the predetermined electromagnetic radiation. The mask includes a first portion configured to totally allow the predetermined electromagnetic radiation passing through, a second portion configured to partially allow the predetermined electromagnetic radiation passing through, and a third portion configured to block the predetermined electromagnetic radiation, wherein the second portion is disposed between the first portion and the third portion.

In some embodiments, the first portion of the mask has a first transmittance of the predetermined electromagnetic radiation, the second portion of the mask has a second transmittance of the predetermined electromagnetic radiation, and the first transmittance is substantially greater than the second transmittance.

In some embodiments, the third portion of the mask has a third transmittance of the predetermined electromagnetic radiation, and the first transmittance and the second transmittance are substantially greater than the third transmittance.

In some embodiments, the third transmittance is substantially equal to zero.

In some embodiments, the mask includes a seventh portion disposed between the first portion and the second portion or between the second portion and the third portion, wherein the seventh portion has a fourth transmittance of the predetermined radiation between the first transmittance and the second transmittance.

In some embodiments, the first portion of the mask includes an opening.

In some embodiments, the second portion of the mask includes a plurality of openings and a plurality of shielding portions, wherein one of the plurality of openings is disposed between two of the plurality of shielding portions.

In some embodiments, the photoresist includes a fourth portion, a fifth portion surrounding the fourth portion, and a sixth portion surrounding the fourth portion and the fifth portion, wherein the fourth portion is wholly removed and the fifth portion is partially removed after the removal of at least the portion of the photoresist.

In some embodiments, the photoresist includes a step after the removal of at least the portion of the photoresist.

In some embodiments, the predetermined electromagnetic radiation is ultraviolet (UV) radiation, visible light or infrared (IR) radiation.

In some embodiments, the photoresist is a positive photoresist soluble in a predetermined developer after the exposure of the photoresist to the predetermined electromagnetic radiation.

In some embodiments, during the exposure of the photoresist, the fourth portion is completely exposed to the predetermined electromagnetic radiation, the fifth portion is partially exposed to the predetermined electromagnetic radiation, and the sixth portion is shielded by the mask.

In some embodiments, the predetermined electromagnetic radiation passes through the first portion towards the fourth portion, partially passes through the second portion toward the fifth portion, and the predetermined electromagnetic radiation is blocked by the third portion.

In some embodiments, the second portion surrounds the first portion, and the third portion surrounds the first portion and the second portion.

In some embodiments, the photoresist is a negative photoresist insoluble in a predetermined developer after the exposure of the photoresist to the predetermined electromagnetic radiation; the photoresist includes a fourth portion, a fifth portion surrounding the fourth portion, and a sixth portion surrounding the fourth portion and the fifth portion; the fourth portion is wholly removed; and the fifth portion is partially removed after the removal of at least the portion of the photoresist.

In some embodiments, during the exposure of the photoresist, the fourth portion is shielded by the mask, the fifth portion is partially exposed to the predetermined electromagnetic radiation, and the sixth portion is completely exposed to the predetermined electromagnetic radiation.

In some embodiments, the predetermined electromagnetic radiation is blocked by the third portion, partially passes through the second portion towards the fifth portion, and passes through the first portion towards the sixth portion.

In some embodiments, the second portion surrounds the third portion, and the first portion surrounds the second portion and the third portion.

Another aspect of the present disclosure provides a mask for manufacturing a semiconductor structure comprising a substrate and a shielding layer disposed over the substrate. The shielding layer includes a first portion having an opening and configured to totally allow the predetermined electromagnetic radiation passing through, a second portion having a plurality of shielding portions spaced from each other and configured to partially allow the predetermined electromagnetic radiation passing through, and a third portion configured to block the predetermined electromagnetic radiation, wherein the second portion is disposed between the first portion and the third portion.

In some embodiments, the second portion of the shielding layer includes a first section having the plurality of second openings with a first density and a second section having the plurality of second openings with a second density, wherein the first density is substantially different from the second density.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
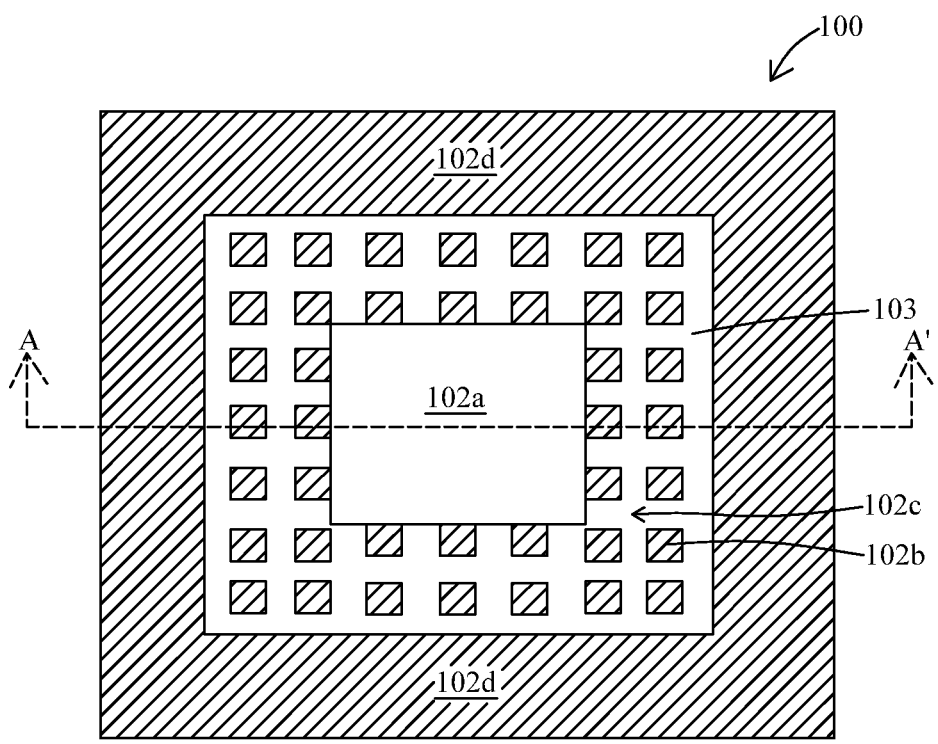
FIG. 1 is a schematic top view of a first mask in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

A semiconductor structure is manufactured by several processes. During fabrication of the semiconductor structure, circuitry patterns are formed over a substrate using photolithography. An electromagnetic radiation such as ultraviolet (UV) radiation is radiated toward the substrate through a mask to pattern a photoresist disposed over the substrate, and then those portions of the photoresist exposed to the electromagnetic radiation are removed. Subsequently, the patterned photoresist serves as an etch mask covering some portions of the substrate, and those portions of the substrate exposed through the patterned photoresist are etched away by an etchant.

However, such fabrication of the semiconductor structure may take more manufacturing time to form the patterned photoresist and may require more masks to form the photoresist in different required patterns.

In the present disclosure, a method of manufacturing a semiconductor structure is disclosed. The method comprises steps of providing a substrate and a photoresist over the substrate; placing a mask over the photoresist; exposing the photoresist to a predetermined electromagnetic radiation through the mask; and removing at least a portion of the photoresist exposed to the predetermined electromagnetic radiation, wherein the mask includes a first portion configured to totally allow the predetermined electromagnetic radiation passing through, a second portion configured to partially allow the predetermined electromagnetic radiation passing through, and a third portion configured to block the predetermined electromagnetic radiation, wherein the second portion is disposed between the first portion and the third portion. As such, the photoresist including at least one step is formed. Such photoresist provides different degrees of protection for different portions of the substrate during etching. Therefore, the substrate including at least one step can be formed by etching the substrate in accordance with different degrees of exposure of the substrate through the photoresist. As a result, manufacturing efficiency is increased or improved, and a number of the masks required for forming the photoresist in required patterns is decreased.

A mask for manufacturing a semiconductor structure is also disclosed. The mask comprises a substrate and a shielding layer disposed over the substrate, wherein the shielding layer includes a first portion having an opening and configured to totally allow the predetermined electromagnetic radiation passing through, a second portion having a plurality of shielding portions spaced from each other and configured to partially allow the predetermined electromagnetic radiation passing through, and a third portion configured to block the predetermined electromagnetic radiation, wherein the second portion is disposed between the first portion and the third portion. As such, the mask has a stepped configuration and thus is configured to provide different degrees of protection for different portions of a substrate during etching. Such mask can form the substrate with at least one step. As a result, fewer masks are involved in the fabrication of the substrate in a required pattern.

Figure 2:
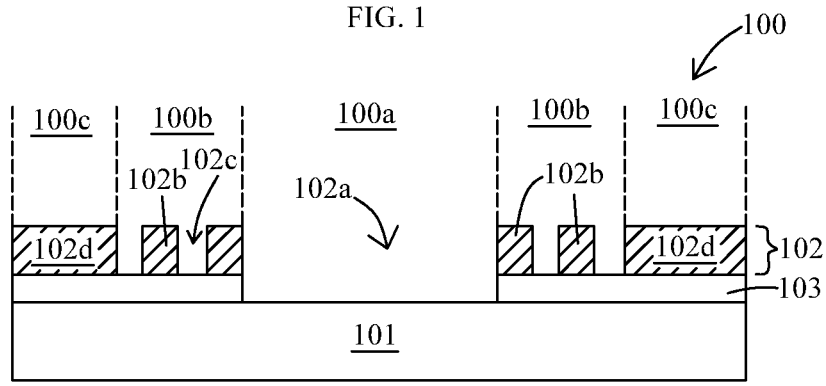
FIG. 2 is a schematic cross-sectional view of the first mask along a line AA' in FIG. 1.

FIG. 1 is a schematic top view of a first mask 100 for manufacturing a semiconductor structure, and FIG. 2 is a schematic cross-sectional view of the first mask 100 along a line AA' of FIG. 1, in accordance with some embodiments of the present disclosure. In some embodiments, the first mask 100 is a photomask configured to allow a predetermined electromagnetic radiation to pass through in a predetermined pattern during photolithography process. In some embodiments, the first mask 100 includes an image of a circuit feature such as a circuitry pattern, an electrical component, etc., and is configured to project the image of the circuit feature onto a semiconductive wafer or a semiconductive substrate during photolithography process. In some embodiments, the first mask 100 is configured to pattern a positive photoresist, which is soluble in a predetermined developer after exposure to the predetermined electromagnetic radiation. In some embodiments, a top cross section of the first mask 100 has a rectangular, quadrilateral or polygonal shape.

In some embodiments, the first mask 100 includes a substrate 101 and a shielding layer 102 disposed over the substrate 101. In some embodiments, the substrate 101 is transparent to the predetermined electromagnetic radiation. The substrate 101 allows the predetermined electromagnetic radiation to pass through. The predetermined electromagnetic radiation can be transmitted from a front side to a back side of the substrate 101 or vice versa. In some embodiments, the substrate 101 is quartz, fused quartz, glass or other suitable material.

In some embodiments, the predetermined electromagnetic radiation is ultraviolet (UV) radiation, laser, visible light, infrared (IR) radiation, x-ray, extreme ultraviolet (EUV), deep ultraviolet (DUV), ions beam, electrons beam, etc. In some embodiments, the predetermined electromagnetic radiation has a wavelength of 365 nm, 248 nm or 193 nm.

In some embodiments, a coating 103 can be included in the first mask 100. In some embodiments, the coating 103 is disposed over the substrate 101. In some embodiments, the coating 103 is configured to partially allow the predetermined electromagnetic radiation passing through. In some embodiments, the coating 103 is a semi-transparent coating. In some embodiments, a transmittance of the coating 103 is substantially less than a transmittance of the substrate 101. In some embodiments, the transmittance of the coating 103 is between the transmittance of the substrate 101 and a transmittance of the shielding layer 102. In some embodiments, the coating 103 includes molybdenum silicide (MoSi) or any other suitable material.

In some embodiments, the shielding layer 102 is opaque to the predetermined electromagnetic radiation. The shielding layer 102 does not allow the predetermined electromagnetic radiation to pass through. In some embodiments, the shielding layer 102 absorbs or blocks about 100% of the predetermined electromagnetic radiation. In some embodiments, the shielding layer 102 includes chromium (Cr) or any other suitable material. In some embodiments, the coating 103 is disposed between the substrate 101 and the shielding layer 102.

In some embodiments, the shielding layer 102 includes several portions having different transmittances of the predetermined electromagnetic radiation. In some embodiments, the shielding layer 102 includes a first portion 100a, a second portion 100b and a third portion 100c.

In some embodiments, the first portion 100a is configured to totally allow the predetermined electromagnetic radiation passing through. A first transmittance of the first portion 100a is about 100% of the predetermined electromagnetic radiation. In some embodiments, the first portion 100a includes a first opening 102a through the shielding layer 102. The predetermined electromagnetic radiation can pass through the first portion 100a of the shielding layer 102 through the first opening 102a. In some embodiments, the first opening 102a is disposed at a central part of the first mask 100. In some embodiments, the first portion 100a is disposed at the central part of the first mask 100 and surrounded by the second portion 100b and the third portion 100c. In some embodiments, the coating 103 is absent from the first portion 100a. None of the coating 103 is present in the first opening 102a.

In some embodiments, the second portion 100b is configured to partially allow the predetermined electromagnetic radiation passing through. A second transmittance of the second portion 100b is substantially greater than 0% and less than 100% of the predetermined electromagnetic radiation. For example, the second transmittance is between about 20% and about 80%. In some embodiments, the second portion 100b includes several shielding portions 102b spaced apart from each other. In some embodiments, a top cross section of the shielding portion 102b has a rectangular, quadrilateral, circular or polygonal shape. In some embodiments, the second portion 100b is disposed between the first portion 100a and the third portion 100c.

In some embodiments, the second portion 100b includes several second openings 102c spaced apart from each other and separating the shielding portions 102b. The predetermined electromagnetic radiation is blocked by the shielding portions 102b and can pass through the second openings 102c in the shielding layer 102. In some embodiments, the first transmittance is substantially greater than the second transmittance. In some embodiments, a portion of the coating 103 is disposed at bottom of the second opening 102c. In some embodiments, a portion of the coating 103 is exposed through the shielding layer 102 in the second portion 100b.

In some embodiments, the third portion 100c is configured to block or absorb the predetermined electromagnetic radiation. The third portion 100c is configured to completely block the predetermined electromagnetic radiation. A third transmittance of the third portion 100c is about 0% of the predetermined electromagnetic radiation. In some embodiments, the third portion 100c includes a shielding member 102d for blocking or absorbing the predetermined electromagnetic radiation. The predetermined electromagnetic radiation cannot pass through the third portion 100c of the shielding layer 102. In some embodiments, the shielding member 102d is disposed adjacent to an edge of the first mask 100. In some embodiments, the shielding member 102d is isolated from the shielding portions 102b by the second openings 102c. In some embodiments, a top cross section of the shielding member 102d has an annular shape. In some embodiments, the shielding member 102d surrounds the shielding portions 102b. In some embodiments, the third portion 100c surrounds the first portion 100a and the second portion 100b.

Figure 3:
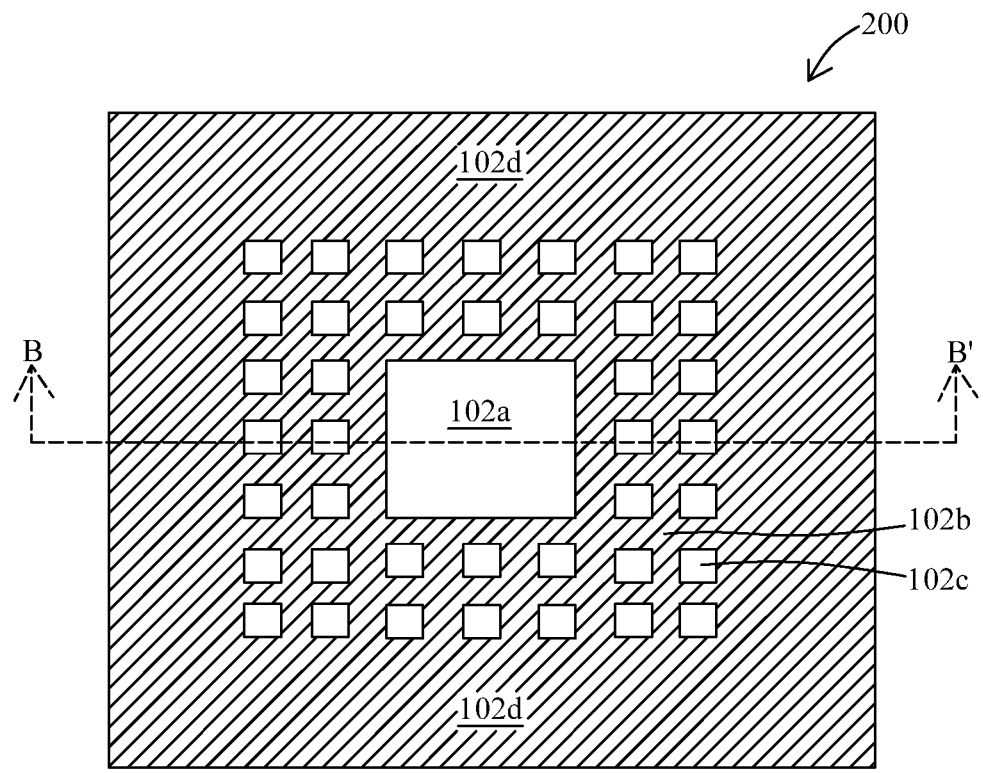
FIG. 3 is a schematic top view of a second mask in accordance with some embodiments of the present disclosure.
Figure 4:
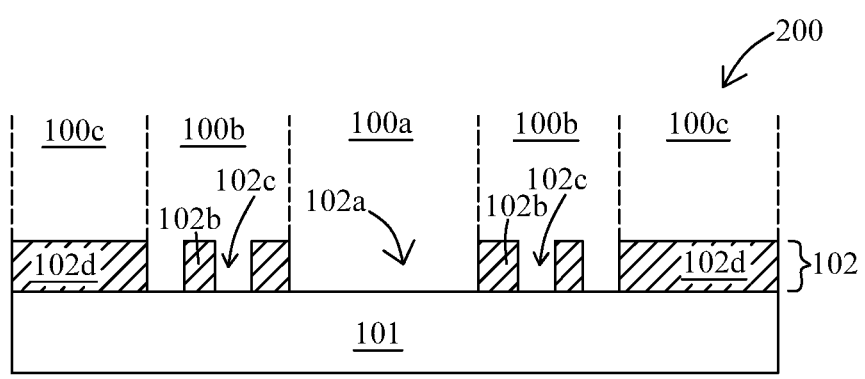
FIG. 4 is a schematic cross-sectional view of the second mask along a line BB' in FIG. 3.

FIG. 3 is a schematic top view of a second mask 200 for manufacturing a semiconductor structure, and FIG. 4 is a schematic cross-sectional view of the second mask 200 along a line BB' of FIG. 3, in accordance with some embodiments of the present disclosure. In some embodiments, the second mask 200 is a photomask configured to allow a predetermined electromagnetic radiation to pass through in a predetermined pattern during photolithography process. In some embodiments, the second mask 200 is configured to pattern a positive photoresist, which is soluble in the predetermined developer after exposure to the predetermined electromagnetic radiation. In some embodiments, the second mask 200 is configured similar to the first mask 100.

Similar to the first mask 100, the second mask 200 includes a substrate 101 and a shielding layer 102, and the shielding layer 102 includes a first portion 100a, a second portion 100b and a third portion 100c. The first portion 100a includes a first opening 102a, the second portion 100b includes several shielding portions 102b and several second openings 102c, and the third portion 100c includes the shielding member 102d.

In some embodiments, the shielding portions 102b are integral with the shielding member 102d. In some embodiments, a top cross section of the second opening 102c has a rectangular, quadrilateral, circular or polygonal shape.

Figure 5:
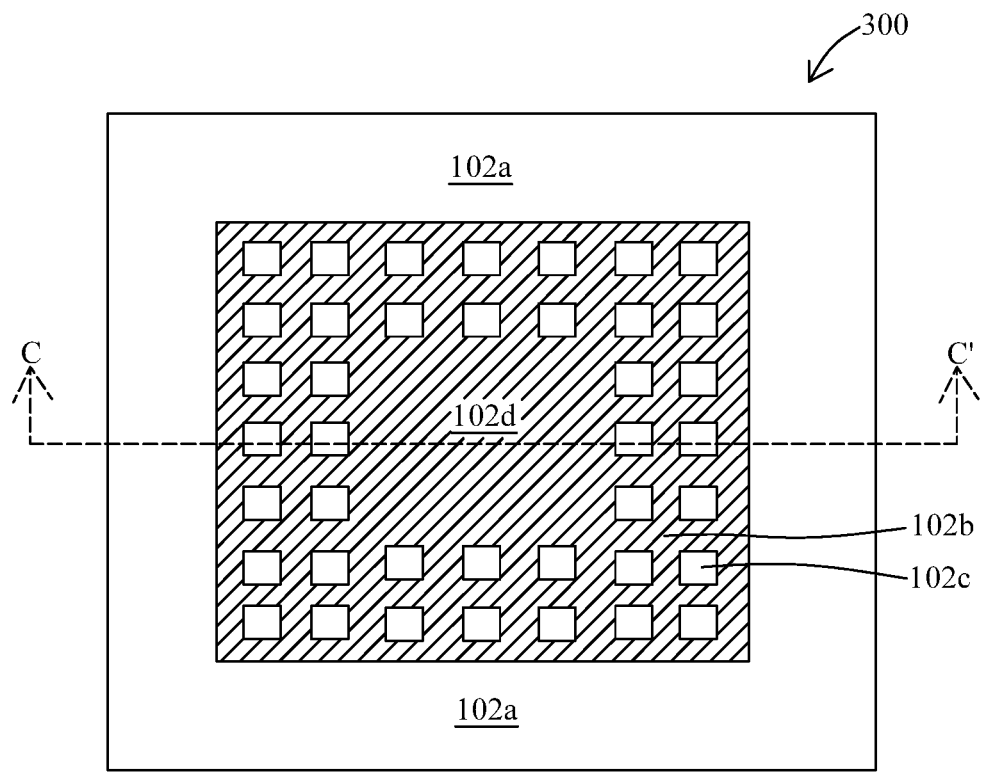
FIG. 5 is a schematic top view of a third mask in accordance with some embodiments of the present disclosure.
Figure 6:
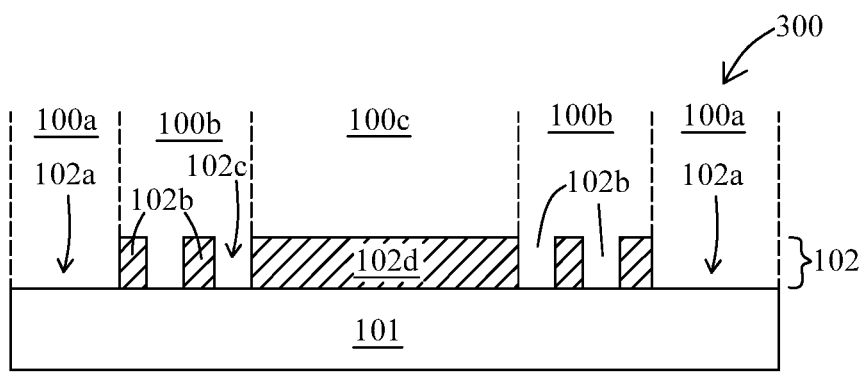
FIG. 6 is a schematic cross-sectional view of the third mask along a line CC' in FIG. 5.

FIG. 5 is a schematic top view of a third mask 300 for manufacturing a semiconductor structure, and FIG. 6 is a schematic cross-sectional view of the third mask 300 along a line CC' of FIG. 5, in accordance with some embodiments of the present disclosure. In some embodiments, the third mask 300 is a photomask configured to allow a predetermined electromagnetic radiation to pass through in a predetermined pattern during photolithography process. In some embodiments, the third mask 300 is configured to pattern a negative photoresist, which is insoluble in the predetermined developer after exposure to the predetermined electromagnetic radiation.

In some embodiments, the third mask 300 includes a substrate 101 and a shielding layer 102, which are configured in manners similar to those of the first mask 100 or the second mask 200 in FIGS. 1 to 4. In some embodiments, the shielding layer 102 includes a first portion 100a, a second portion 100b and a third portion 100c. In some embodiments, the first portion 100a is disposed adjacent to an edge of the third mask 300, the third portion 100c is disposed at a central part of the third mask 300, and the second portion 100b is disposed between the first portion 100a and the third portion 100c.

In some embodiments, the first portion 100a is configured to totally allow the predetermined electromagnetic radiation passing through. In some embodiments, the first portion 100a includes a first opening 102a surrounding the second portion 100b and the third portion 100c. In some embodiments, a top cross section of the first portion 100a has an annular shape.

In some embodiments, the second portion 100b is configured to partially allow the predetermined electromagnetic radiation passing through. In some embodiments, the second portion 100b includes several shielding portions 102b and several second openings 102c. In some embodiments, the shielding portions 102b surround the second openings 102c. In some embodiments, a top cross section of the second opening 102c has a rectangular, quadrilateral, circular or polygonal shape.

In some embodiments, the third portion 100c is configured to block or absorb the predetermined electromagnetic radiation. The third portion 100c totally blocks the predetermined electromagnetic radiation. In some embodiments, the third portion 100c includes a shielding member 102d for blocking or absorbing the predetermined electromagnetic radiation. In some embodiments, the shielding member 102d is disposed at the central part of the third mask 300. In some embodiments, the shielding member 102d is integral with the shielding portions 102b. In some embodiments, the third portion 100c is surrounded by the first portion 100a and the second portion 100b.

Figure 7:
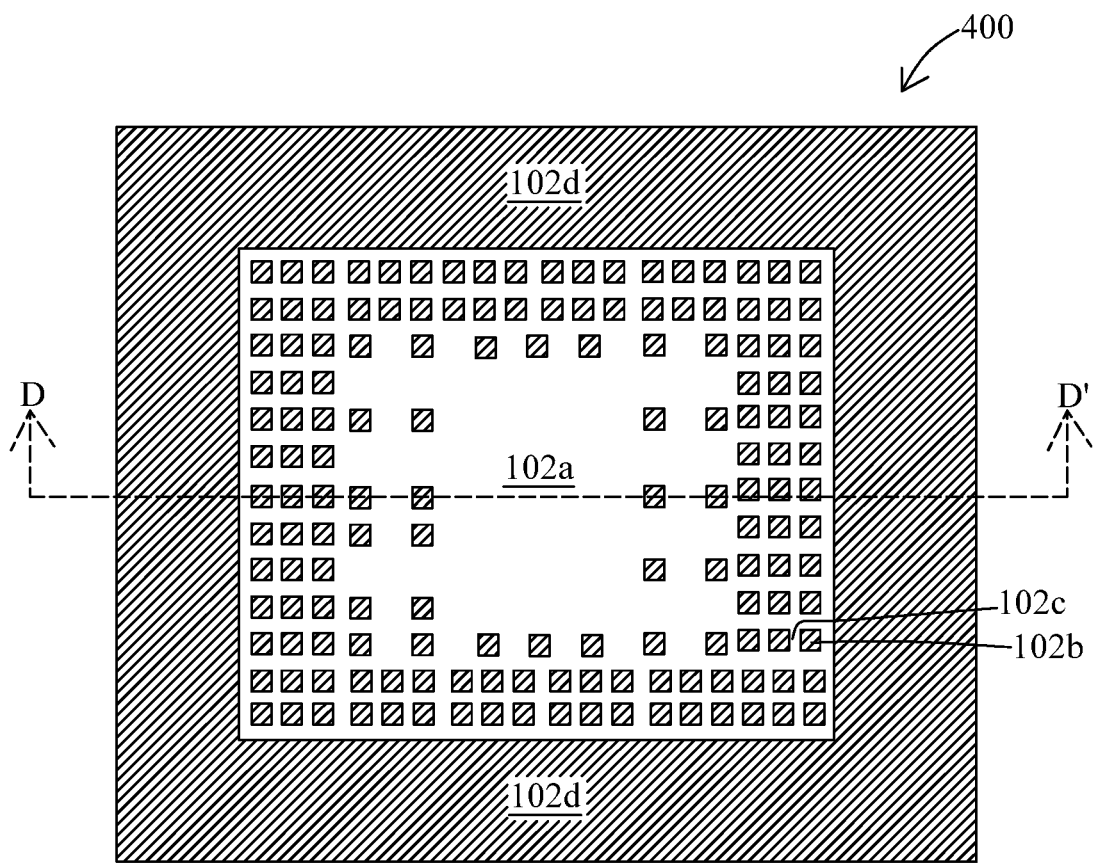
FIG. 7 is a schematic top view of a fourth mask in accordance with some embodiments of the present disclosure.
Figure 8:
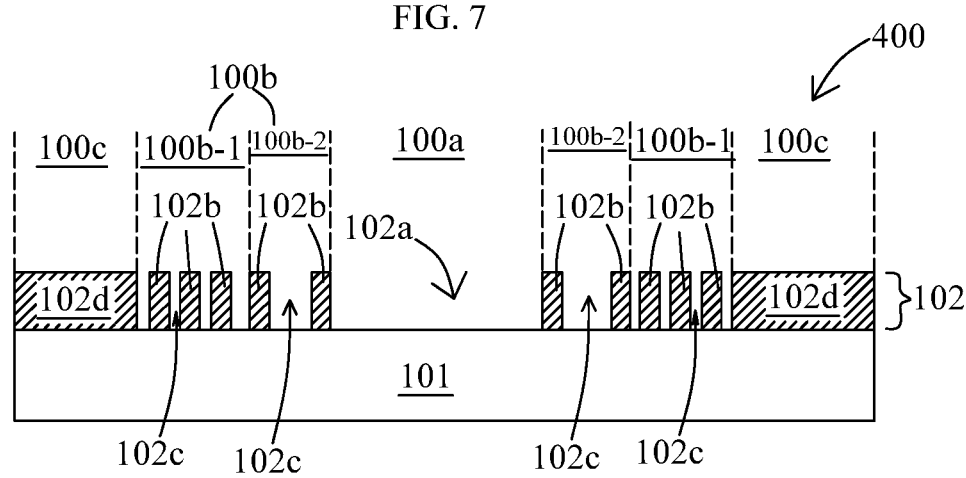
FIG. 8 is a schematic cross-sectional view of the fourth mask along a line DD' in FIG. 7.

FIG. 7 is a schematic top view of a fourth mask 400 for manufacturing a semiconductor structure, and FIG. 8 is a schematic cross-sectional view of the fourth mask 400 along a line DD' of FIG. 7, in accordance with some embodiments of the present disclosure.

In some embodiments, the fourth mask 400 is a photomask configured to allow a predetermined electromagnetic radiation to pass through in a predetermined pattern during photolithography process. In some embodiments, the fourth mask 400 is configured to pattern a positive photoresist, which is soluble in the predetermined developer after exposure to the predetermined electromagnetic radiation. In some embodiments, the fourth mask 400 is configured similar to the first mask 100.

Similar to the first mask 100, the fourth mask 400 includes a substrate 101 and a shielding layer 102, and the shielding layer 102 includes a first portion 100a, a second portion 100b and a third portion 100c. The first portion 100a includes a first opening 102a, the second portion 100b includes several shielding portions 102b and several second openings 102c, and the third portion 100c includes the shielding member 102d.

In some embodiments, the second portion 100b of the shielding layer 102 includes a first section 100b-1 having the shielding portions 102b with a first density, and a second section 100b-2 having the shielding portions 102b with a second density. In some embodiments, the first density is substantially different from the second density. In some embodiments, the first section 100b-1 surrounds the second section 100b-2.

In some embodiments, the first density is substantially greater than the second density. In some embodiments, a fourth transmittance of the predetermined electromagnetic radiation through the first section 100b-1 is substantially less than a fifth transmittance of the predetermined electromagnetic radiation through the second section 100b-2, because more predetermined electromagnetic radiation is blocked or absorbed by the shielding portions 102b in the first section 100b-1 having a higher density (the first density) than is blocked or absorbed by the shielding portions 102b in the second section 100b-2 having a lower density (the second density). In other words, more predetermined electromagnetic radiation can pass through the second openings 102c in the second section 100b-2 than through the second openings 102c in the first section 100b-1.

Figure 9:
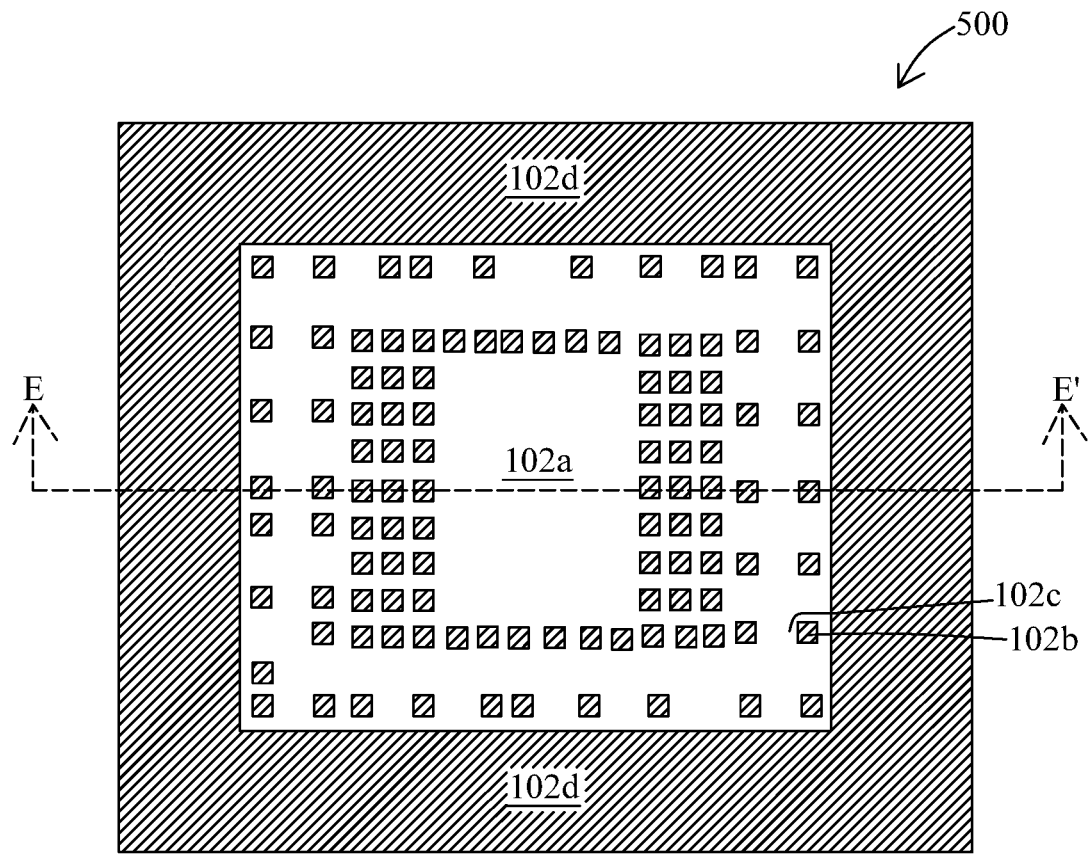
FIG. 9 is a schematic top view of a fifth mask in accordance with some embodiments of the present disclosure.
Figure 10:
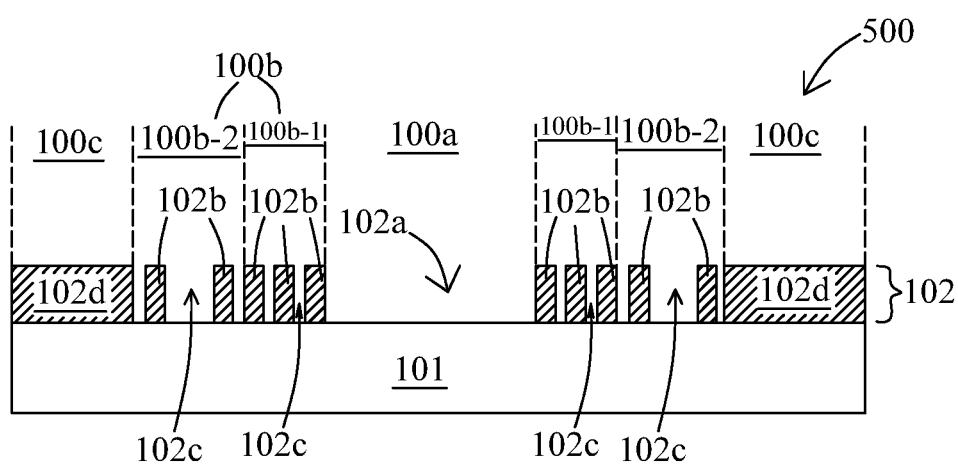
FIG. 10 is a schematic cross-sectional view of the fifth mask along a line EE' in FIG. 9.

FIG. 9 is a schematic top view of a fifth mask 500 for manufacturing a semiconductor structure, and FIG. 10 is a schematic cross-sectional view of the fifth mask 500 along a line EE' of FIG. 9, in accordance with some embodiments of the present disclosure. In some embodiments, the fifth mask 500 is configured to pattern a positive photoresist, which is soluble in the predetermined developer after exposure to the predetermined electromagnetic radiation.

Similar to the fourth mask 400, the fifth mask 500 includes a substrate 101 and a shielding layer 102, and the shielding layer 102 includes a first portion 100a, a second portion 100b and a third portion 100c. The first portion 100a includes a first opening 102a, the second portion 100b includes several shielding portions 102b and several second openings 102c, and the third portion 100c includes the shielding member 102d.

In some embodiments, the second portion 100b of the shielding layer 102 includes a first section 100b-1 having the shielding portions 102b with a first density, and a second section 100b-2 having the shielding portions 102b with a second density. In some embodiments, the first density is substantially different from the second density. In some embodiments, the first density is substantially greater than the second density. In some embodiments, the first section 100b-1 is surrounded by the second section 100b-2. In some embodiments, the first section 100b-1 surrounds the first portion 100a.

Figure 11:
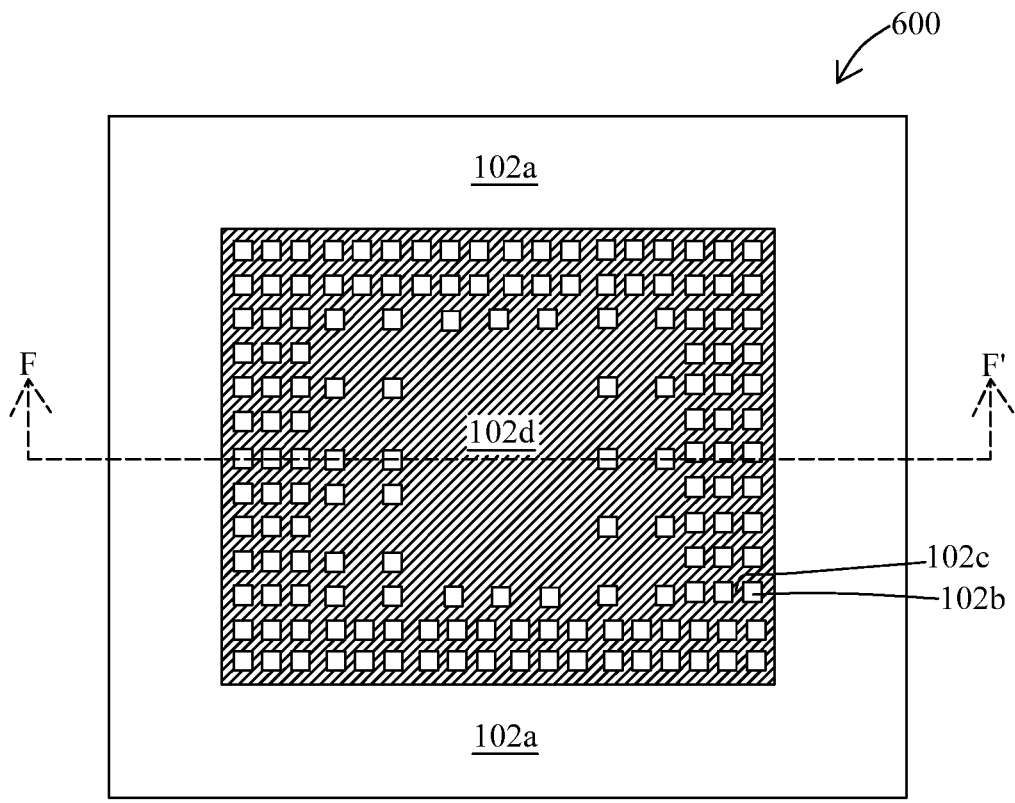
FIG. 11 is a schematic top view of a sixth mask in accordance with some embodiments of the present disclosure.
Figure 12:
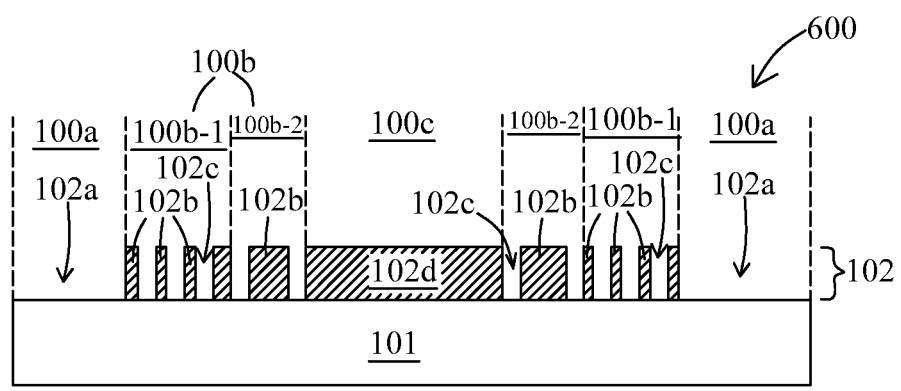
FIG. 12 is a schematic cross-sectional view of the sixth mask along a line FF' in FIG. 11.

FIG. 11 is a schematic top view of a sixth mask 600 for manufacturing a semiconductor structure, and FIG. 12 is a schematic cross-sectional view of the sixth mask 600 along a line FF' of FIG. 11, in accordance with some embodiments of the present disclosure.

In some embodiments, the sixth mask 600 is a photomask configured to allow a predetermined electromagnetic radiation to pass through in a predetermined pattern during photolithography process. In some embodiments, the sixth mask 600 is configured to pattern a negative photoresist, which is insoluble in the predetermined developer after exposure to the predetermined electromagnetic radiation. In some embodiments, the sixth mask 600 is configured similar to the third mask 300.

Similar to the third mask 300, the sixth mask 600 includes a substrate 101 and a shielding layer 102, and the shielding layer 102 includes a first portion 100a, a second portion 100b and a third portion 100c. The first portion 100a includes a first opening 102a, the second portion 100b includes several shielding portions 102b and several second openings 102c, and the third portion 100c includes the shielding member 102d.

In some embodiments, the second portion 100b of the shielding layer 102 includes a first section 100b-1 having the shielding portions 102b with a first density, and a second section 100b-2 having the shielding portions 102b with a second density. In some embodiments, the first density is substantially different from the second density. In some embodiments, the first section 100b-1 surrounds the second section 100b-2.

In some embodiments, the first density is substantially less than the second density. In some embodiments, a fourth transmittance of the predetermined electromagnetic radiation through the first section 100b-1 is substantially greater than a fifth transmittance of the predetermined electromagnetic radiation through the second section 100b-2, because more predetermined electromagnetic radiation is blocked or absorbed by the shielding portions 102b in the second section 100b-2 having a higher density (the second density) than is blocked or absorbed by the shielding portions 102b in the first section 100b-2 having a lower density (the first density). In other words, more predetermined electromagnetic radiation can pass through the second openings 102c in the first section 100b-1 than through the second openings 102c in the second section 100b-2.

Figure 13:
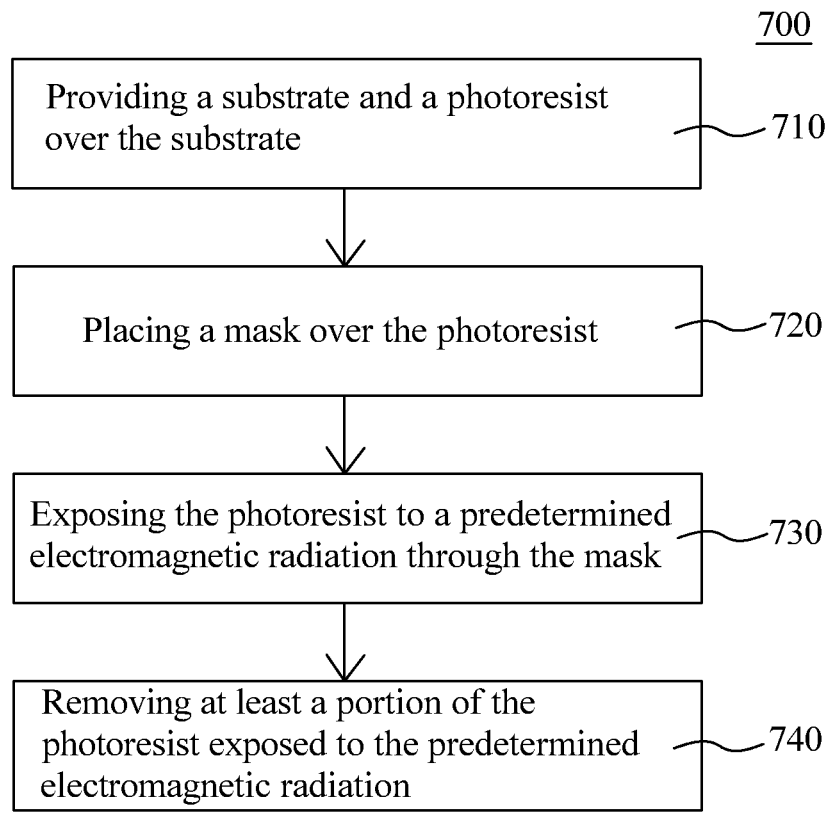
FIG. 13 is a flowchart of a method of manufacturing a semiconductor structure in accordance with some embodiments of the present disclosure.

In the present disclosure, a method of manufacturing a semiconductor structure is also disclosed. In some embodiments, the semiconductor structure can be formed by a method 700, as shown in FIG. 13. The method 700 includes a number of operations and the description and illustration are not deemed as a limitation to the sequence of the operations. The method 700 includes a number of steps (710, 720, 730 and 740).

Figure 14:
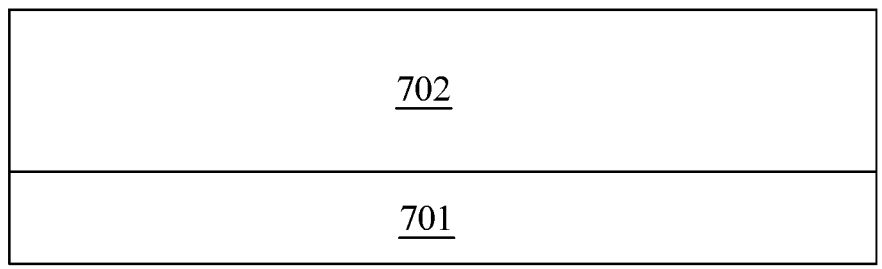
FIGS. 14 to 32 are schematic views of manufacturing the semiconductor structure by the method of FIG. 13 in accordance with some embodiments of the present disclosure.

In step 710, a first substrate 701 and a photoresist 702 are provided as shown in FIG. 14. The photoresist 702 is disposed over the first substrate 701. In some embodiments, the first substrate 701 is a semiconductive substrate or wafer. In some embodiments, the first substrate 701 includes semiconductive material such as silicon, germanium, gallium, arsenic, or a combination thereof. In some embodiments, the first substrate 701 includes material such as ceramic, glass or the like. In some embodiments, a top cross section of the first substrate 701 has a quadrilateral, rectangular, square or polygonal shape.

In some embodiments, the first substrate 701 is subsequently fabricated with a predetermined functional circuit thereon. In some embodiments, several conductive traces and several electrical components such as transistors, diodes, etc. are subsequently formed over the first substrate 701.

In some embodiments, the photoresist 702 is coated on the substrate 701. In some embodiments, the photoresist 702 is a light-sensitive material with chemical properties that depend on exposure to an electromagnetic radiation. The photoresist 702 is sensitive to a predetermined electromagnetic radiation such as ultraviolet (UV) radiation, visible light or infrared (IR) radiation, such that the chemical properties of the photoresist 702 are changed upon exposure to the predetermined electromagnetic radiation. In some embodiments, the photoresist 702 is disposed over the first substrate 701 by spin coating or any other suitable process. In some embodiments, the photoresist 702 is a positive photoresist 702a, which is soluble in a predetermined developer after exposure to the predetermined electromagnetic radiation. In some embodiments, the positive photoresist 702a is used for the method 700 as shown in FIGS. 15 to 17.

Figure 15:
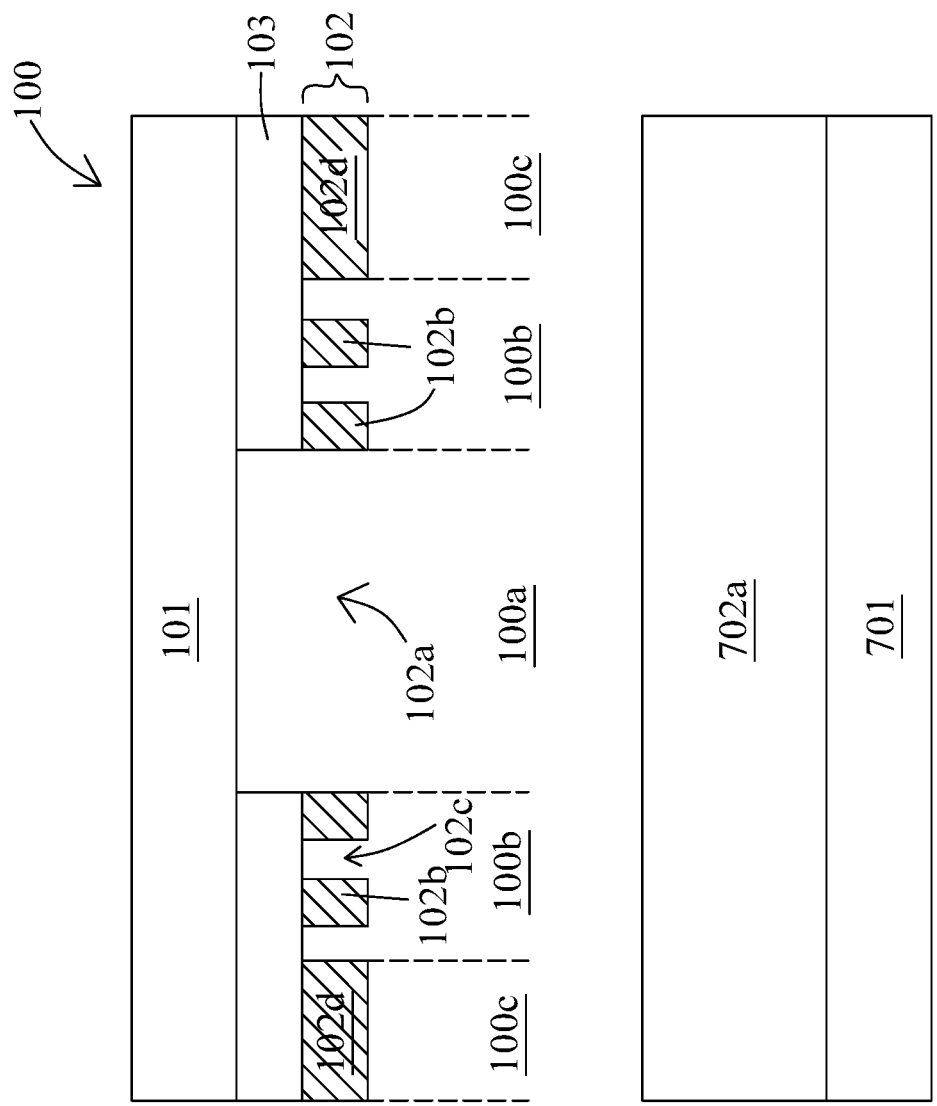

In step 720, a first mask 100 is placed over the positive photoresist 702a as shown in FIG. 15. In some embodiments, the first mask 100 includes a second substrate 101 and a shielding layer 102 disposed over the second substrate 101. In some embodiments, the first mask 100 is configured as described above or as shown in FIGS. 1 and 2. In some embodiments, the first mask 100 is flipped and then disposed over the positive photoresist 702a. In some embodiments, the first mask 100 is vertically aligned with the positive photoresist 702a and the first substrate 701.

Figure 16:
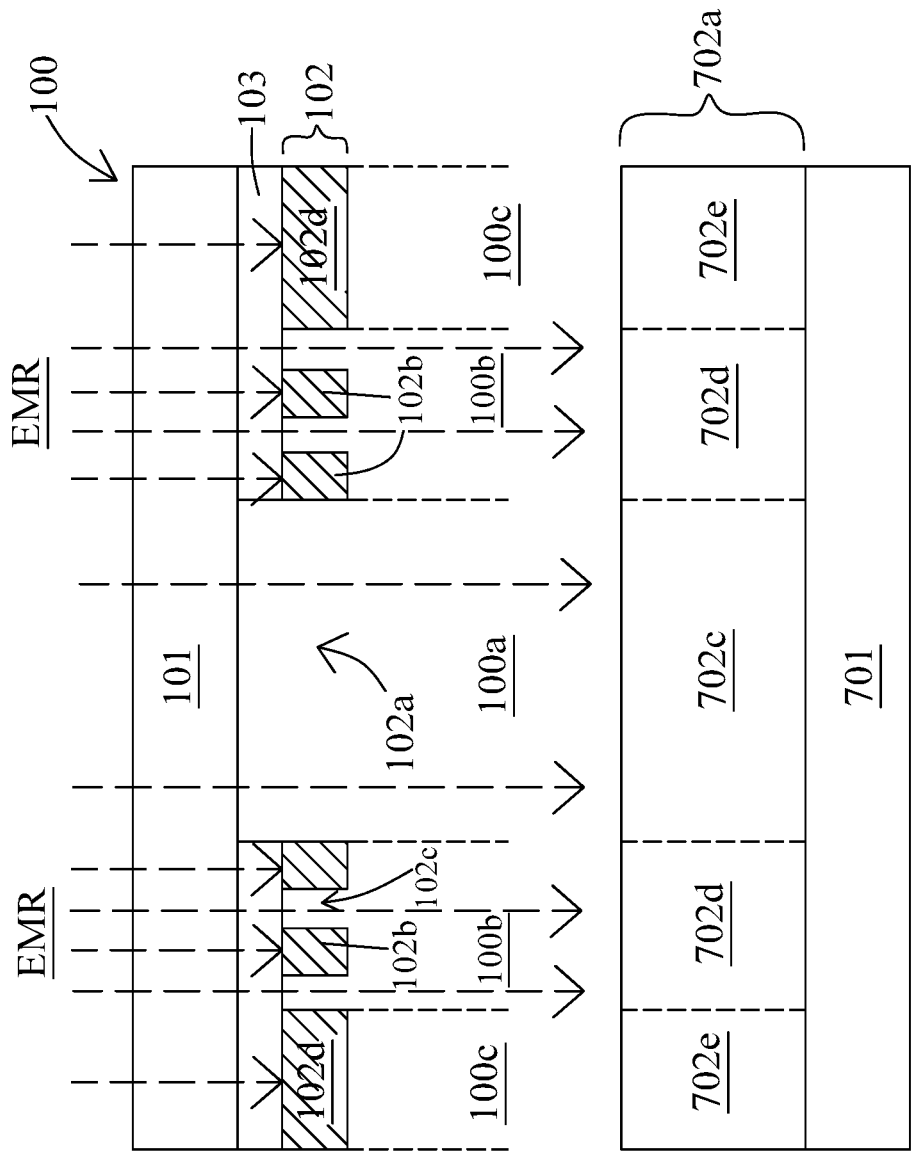
Figure 17:
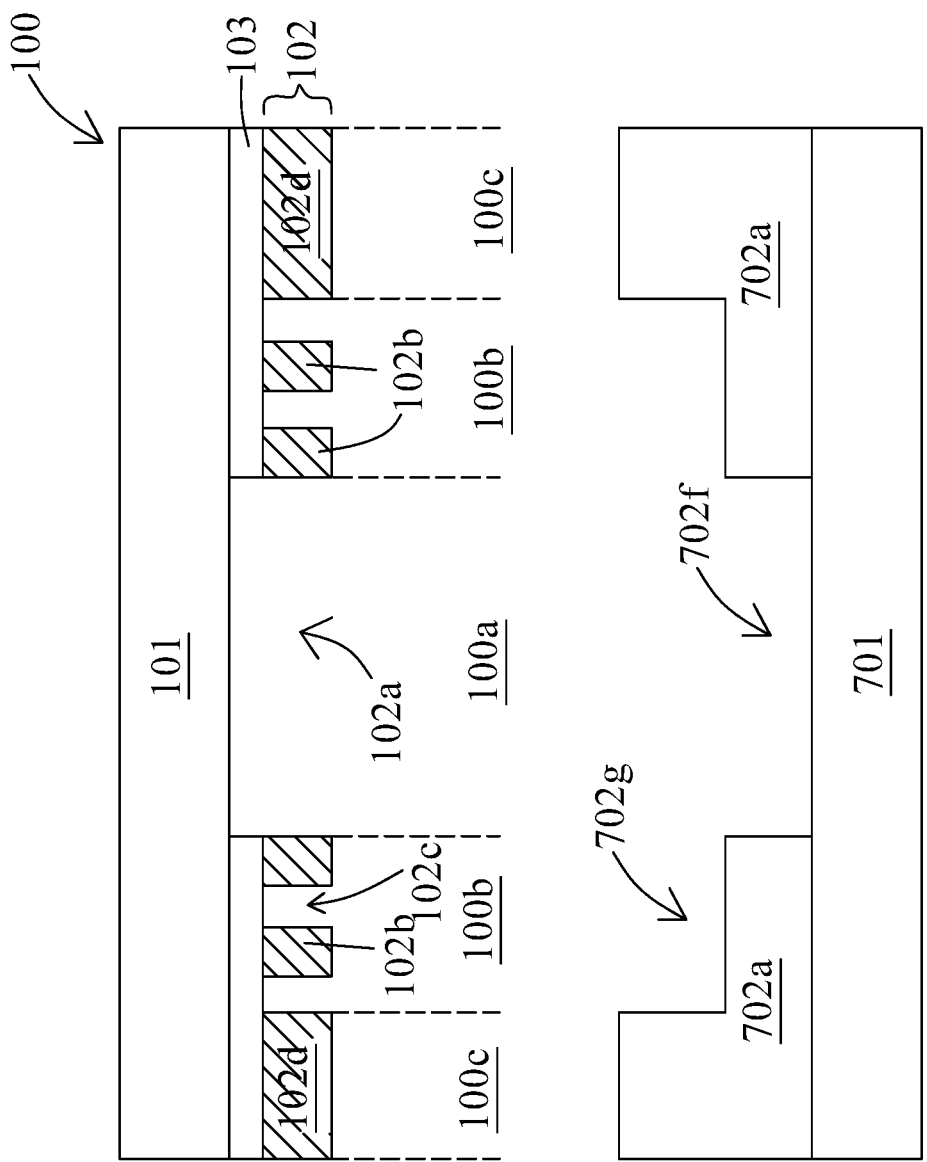

In step 730, the positive photoresist 702a is exposed to a predetermined electromagnetic radiation (labeled as EMR and indicated by dashed arrows) through the first mask 100 as shown in FIG. 16. In some embodiments, the predetermined electromagnetic radiation is UV radiation. In some embodiments, the substrate 101 is transparent to the predetermined electromagnetic radiation. In some embodiments, the shielding layer 102 of the first mask 100 blocks the predetermined electromagnetic radiation from passing through.

In some embodiments, the first mask 100 includes a first portion 100a configured to totally allow the predetermined electromagnetic radiation passing through, a second portion 100b configured to partially allow the predetermined electromagnetic radiation passing through, and a third portion 100c configured to block the predetermined electromagnetic radiation. The second portion 100b is disposed between the first portion 100a and the third portion 100c. The second portion 100b surrounds the first portion 100a, and the third portion 100c surrounds the first portion 100a and the second portion 100b.

In some embodiments, the first portion 100a has a first transmittance of the predetermined electromagnetic radiation, the second portion 100b has a second transmittance of the predetermined electromagnetic radiation, and the third portion 100c has a third transmittance of the predetermined electromagnetic radiation. In some embodiments, the first transmittance is substantially greater than the second transmittance, and the first transmittance and the second transmittance are substantially greater than the third transmittance. In some embodiments, the first transmittance is about 100% of the predetermined electromagnetic radiation, the second transmittance is between 0% and 100% of the predetermined electromagnetic radiation, and the third transmittance is about 0% of the predetermined electromagnetic radiation.

In some embodiments, the first portion 100a includes a first opening 102a. In some embodiments, the second portion 100b includes several shielding portions 102b and several second openings 102c. In some embodiments, the third portion 100c includes a shielding member 102d. In some embodiments, the shielding portions 102b and the shielding member 102d block the predetermined electromagnetic radiation from passing through. In some embodiments, the first opening 102a and the second openings 102c of the shielding layer 102 totally allow the predetermined electromagnetic radiation passing through. In some embodiments, the predetermined electromagnetic radiation can partially pass through the coating 103, and therefore the predetermined electromagnetic radiation can partially pass through the second openings 102c. As a result, different portions of the positive photoresist 702a receive different intensities of the predetermined electromagnetic radiation.

In some embodiments, the positive photoresist 702a includes a fourth portion 702c, a fifth portion 702d and a sixth portion 702e. In some embodiments, the fifth portion 702d surrounds the fourth portion 702c, and the sixth portion 702e surrounds the fourth portion 702c and the fifth portion 702d.

In some embodiments, during the exposure of the positive photoresist 702a to the predetermined electromagnetic radiation, the fourth portion 702c is completely exposed to the predetermined electromagnetic radiation, the fifth portion 702d is partially exposed to the predetermined electromagnetic radiation, and the sixth portion 702e is shielded by the shielding member 102d of the first mask 100. The predetermined electromagnetic radiation passes through the first portion 100a toward the fourth portion 702c, partially passes through the second portion 100b toward the fifth portion 702d, and is blocked by the shielding member 102d in the third portion 100c.

In step 740, at least a portion of the positive photoresist 702a exposed to the predetermined electromagnetic radiation is removed as shown in FIG. 17. In some embodiments, the wholly exposed fourth portion 702c is soluble in the predetermined developer and thus wholly removable. In some embodiments, the partially exposed fifth portion 702d is partially soluble in the predetermined developer and thus partially removable. In some embodiments, the unexposed sixth portion 702e is insoluble in the predetermined developer and thus unremovable. As a result, the fourth portion 702c of the positive photoresist 702a is wholly removed, the fifth portion 702d is partially removed, and the sixth portion 702e is remained. In some embodiments, the fourth portion 702c is wholly removed to form a third opening 702f. In some embodiments, a step 702g is formed after the removal of at least the portion of the positive photoresist 702a.

Figure 18:
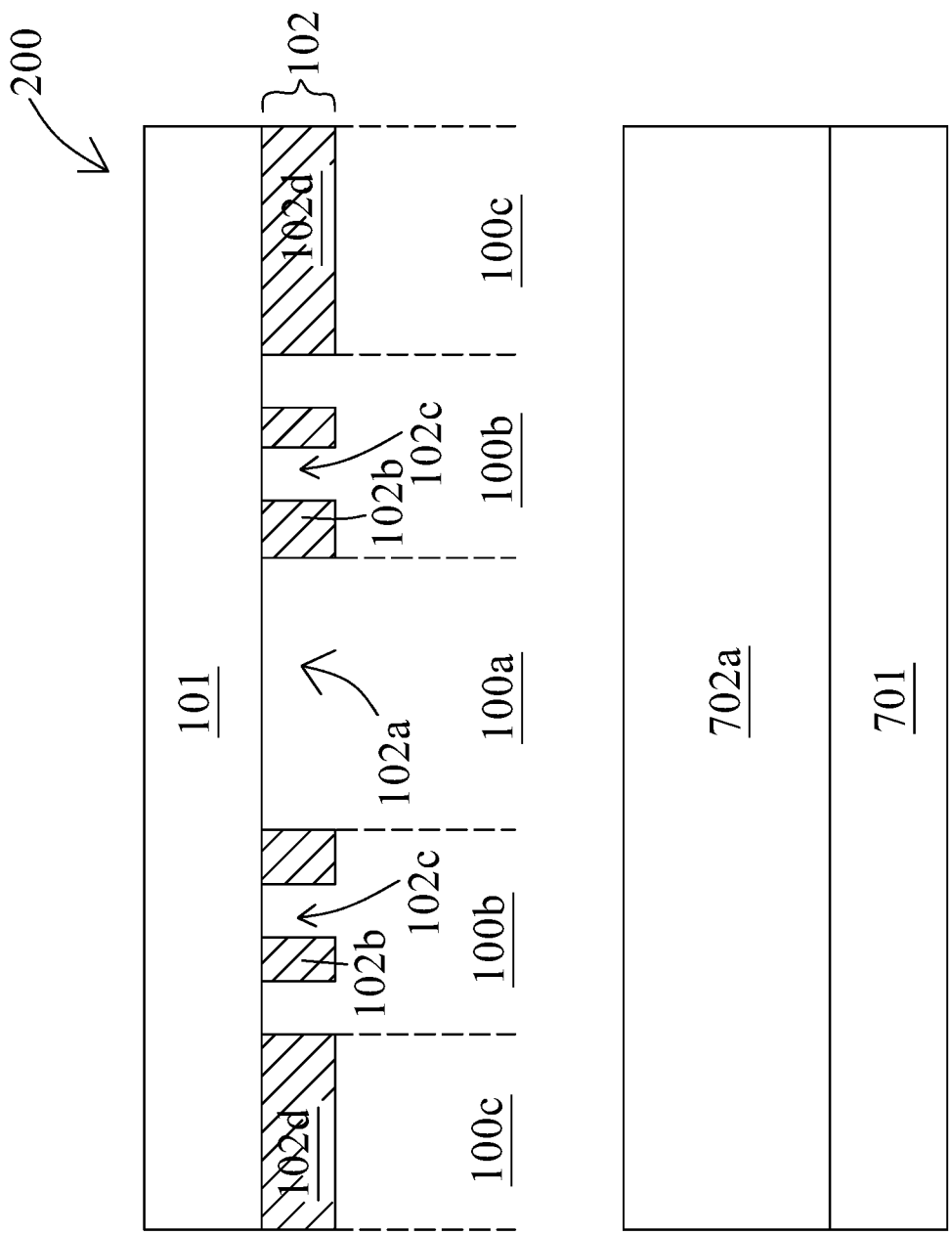
Figure 19:
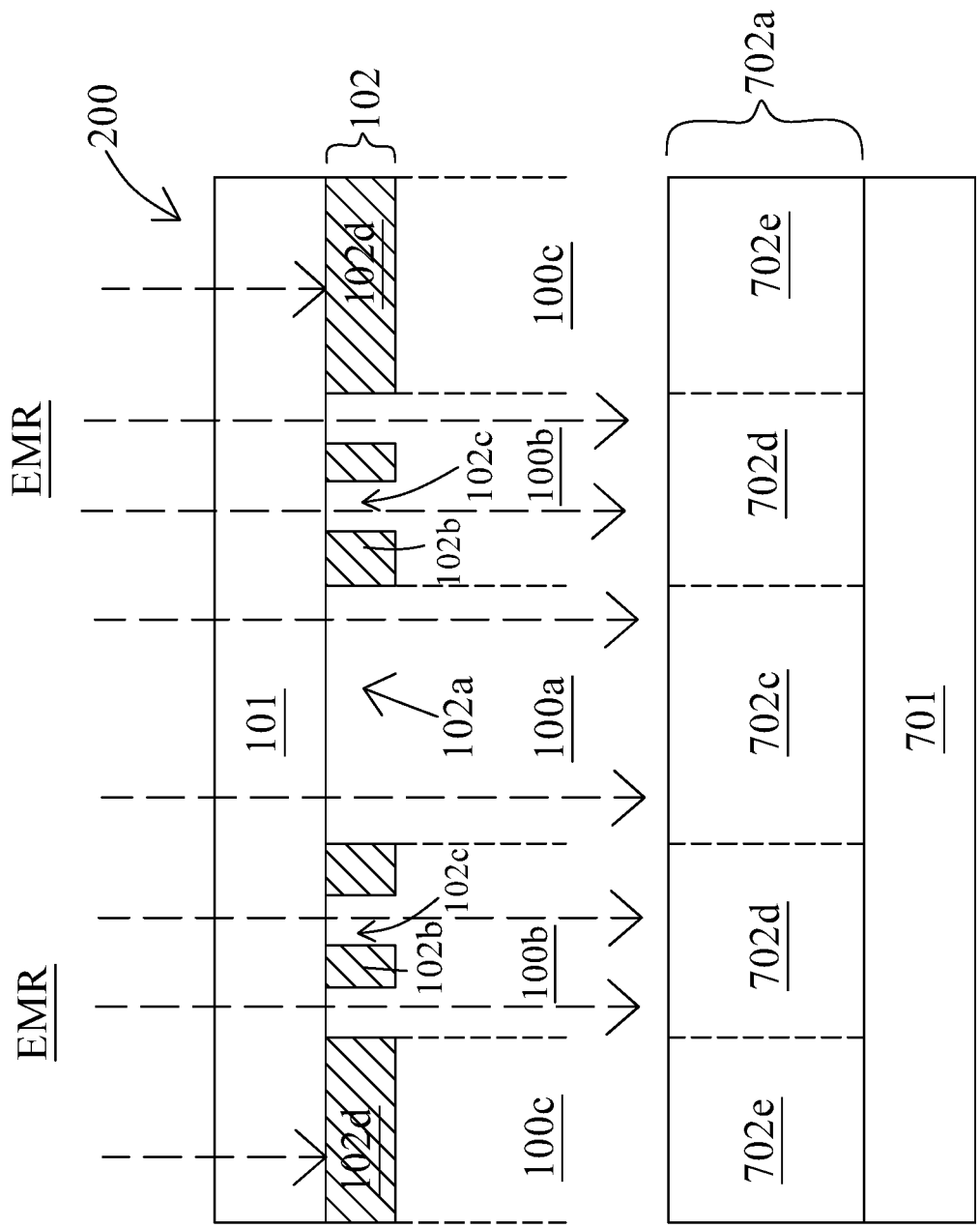
Figure 20:
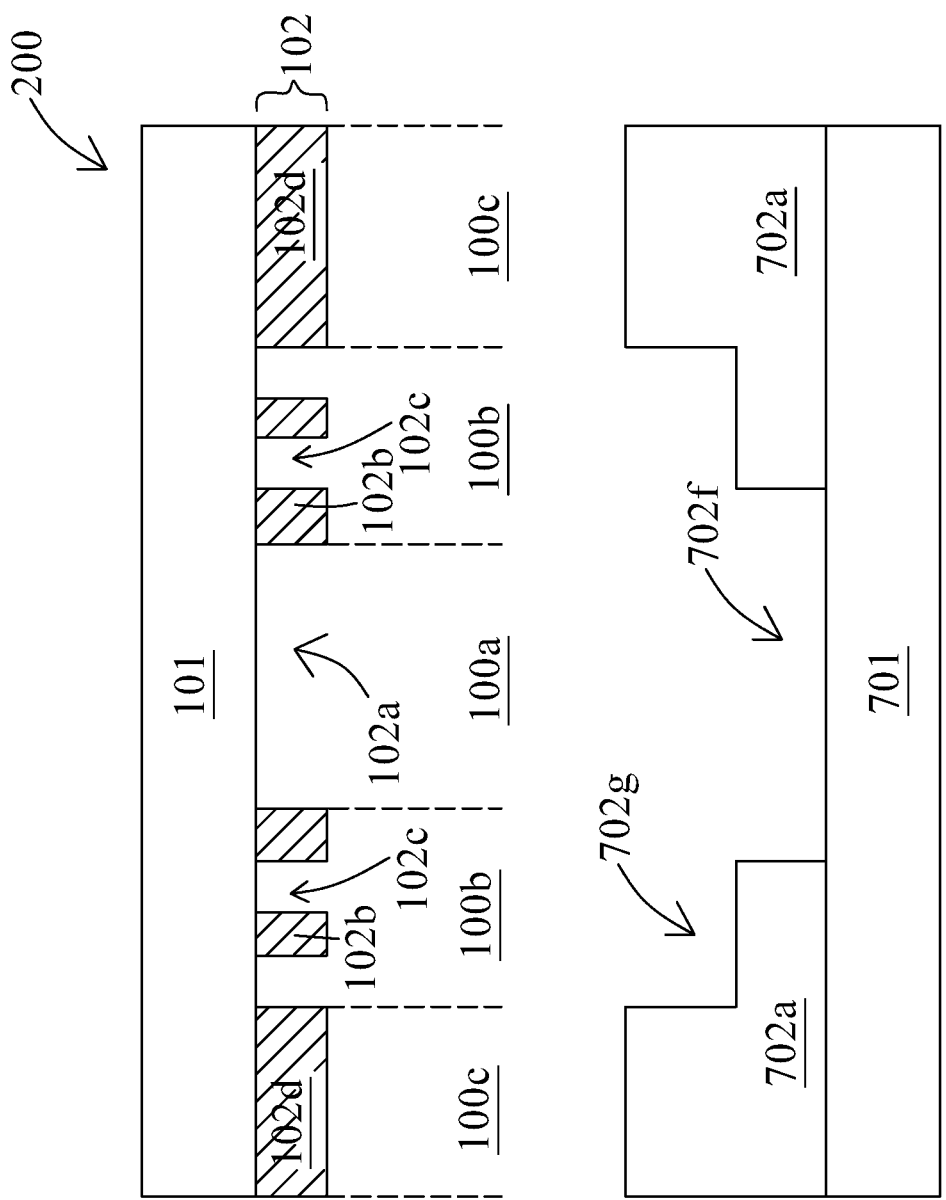

In some embodiments, a second mask 200 is used for implementing the steps 720, 730 and 740 of the method 700 as shown in FIGS. 18 to 20. In some embodiments, the second mask 200 is configured as described above or as shown in FIGS. 3 and 4.

In some embodiments of the step 720, the second mask 200 is placed over the positive photoresist 702a as shown in FIG. 18. In some embodiments, the second mask 200 is vertically aligned with the positive photoresist 702a and the first substrate 701.

In some embodiments of the step 730, the positive photoresist 702a is exposed to the predetermined electromagnetic radiation (labeled as EMR and indicated by dashed arrows) through the second mask 200 as shown in FIG. 19. Different portions of the positive photoresist 702a receive different intensities of the predetermined electromagnetic radiation.

In some embodiments of the step 740, at least a portion of the positive photoresist 702a exposed to the predetermined electromagnetic radiation is removed as shown in FIG. 20. The fourth portion 702c of the positive photoresist 702a is wholly removed, the fifth portion 702d is partially removed, and the sixth portion 702e is remained.

Figure 21:
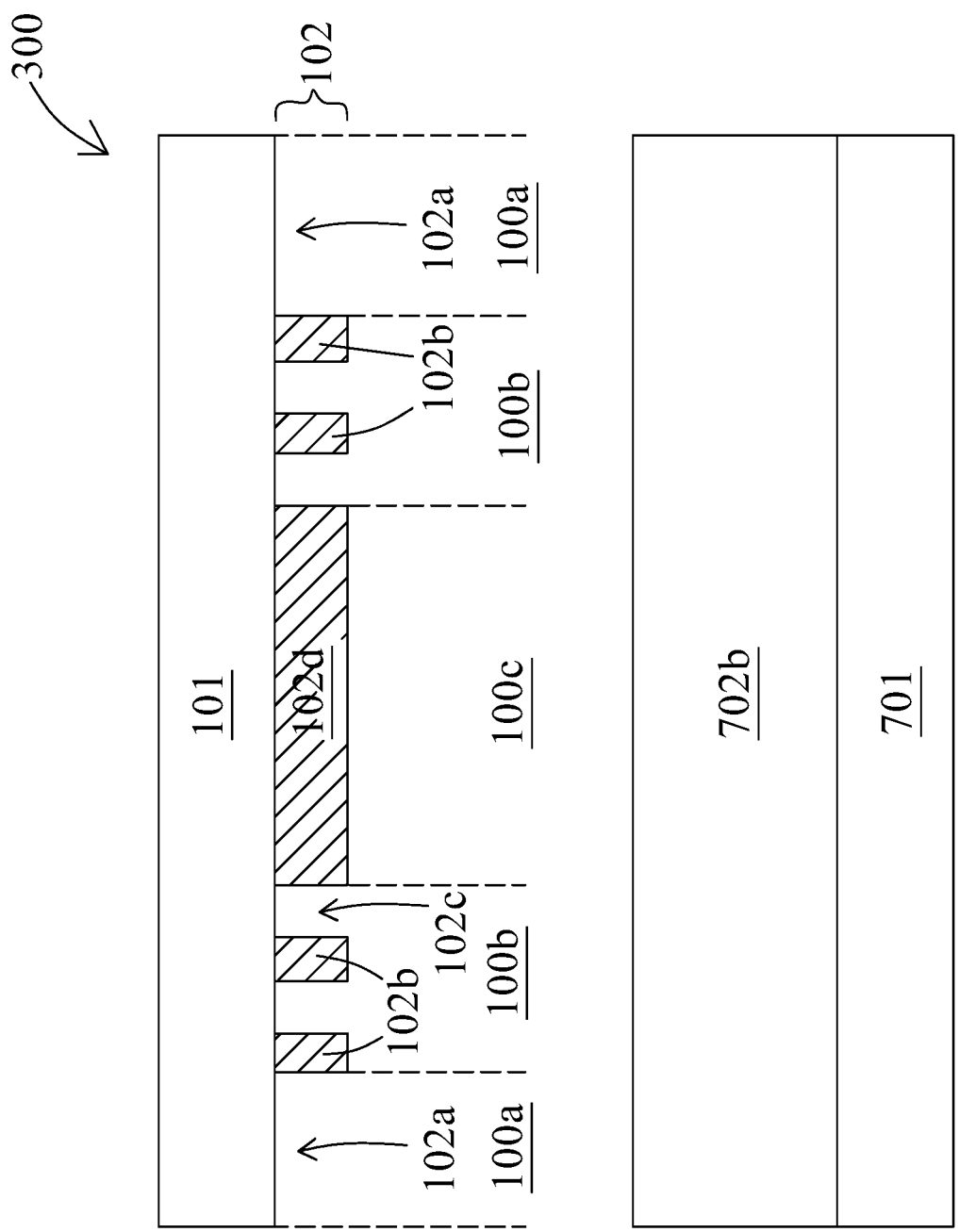
Figure 22:
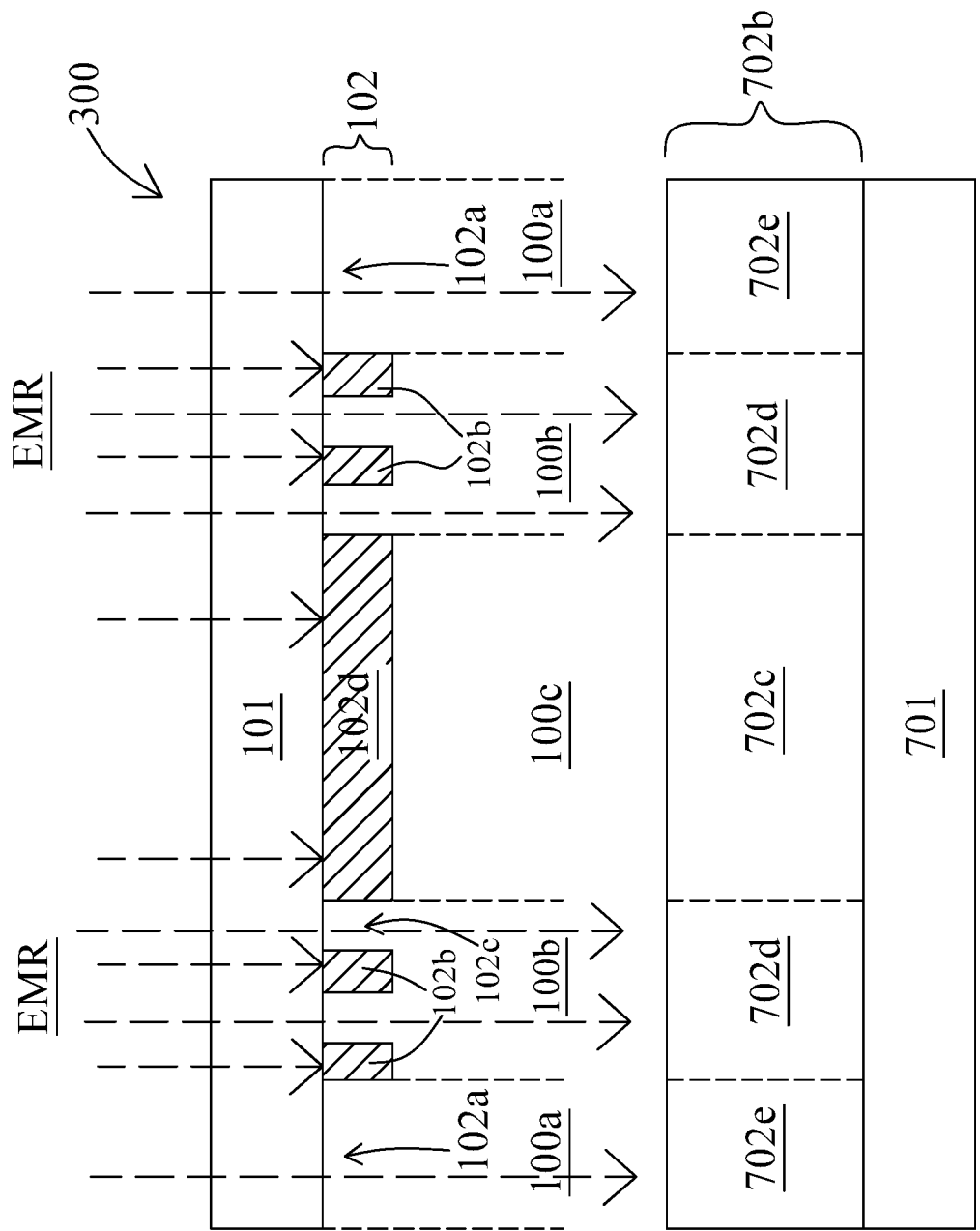
Figure 23:
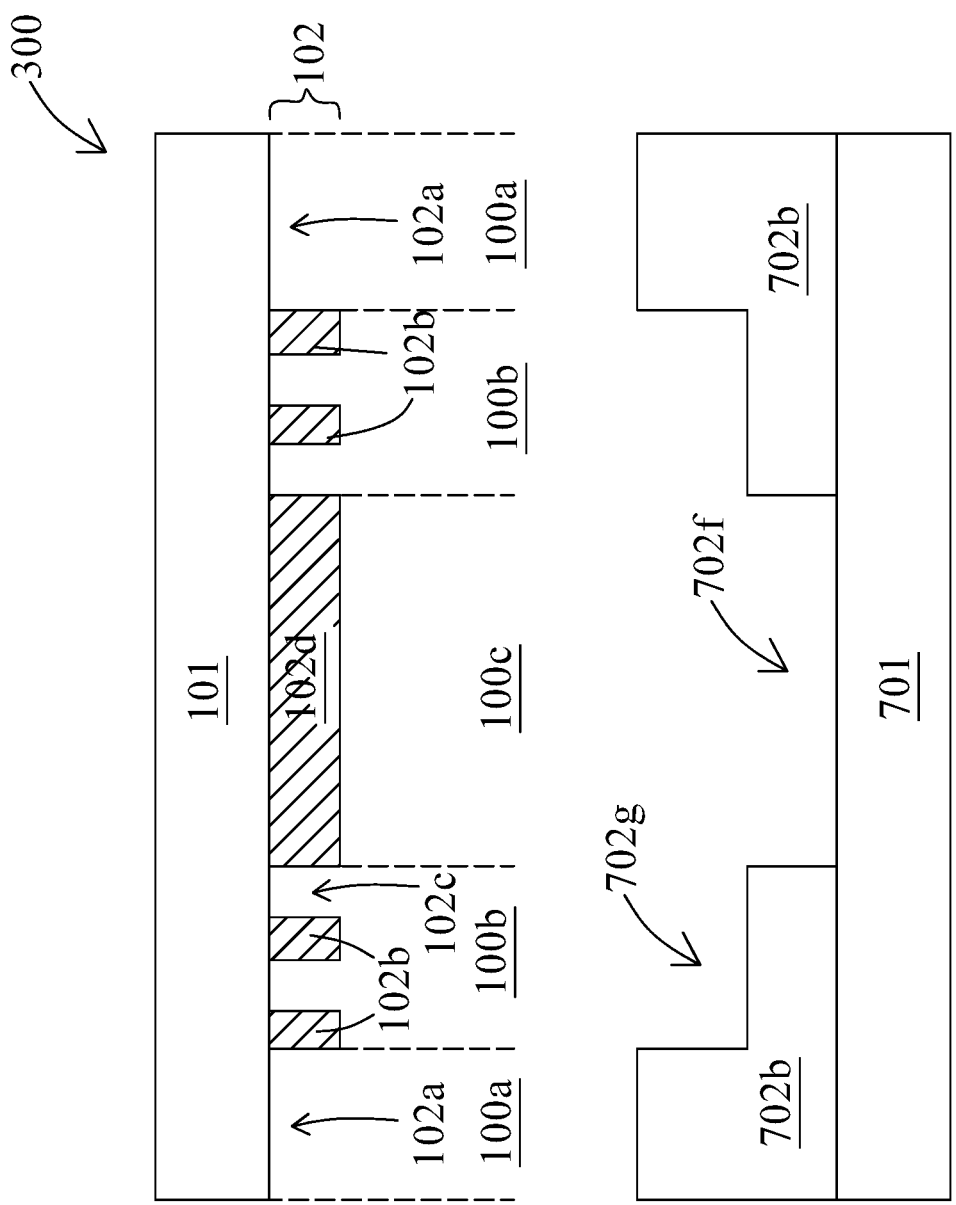

In some embodiments, a negative photoresist 702b is provided over the first substrate 701, and a third mask 300 is used for implementing the steps 710, 720, 730 and 740 of the method 700 as shown in FIGS. 21 to 23. In some embodiments, the third mask 300 is configured as described above or as shown in FIGS. 5 and 6.

In some embodiments of the step 710, the negative photoresist 702b is disposed over the first substrate 701 as shown in FIG. 21. In some embodiments, the negative photoresist 702b is insoluble in a predetermined developer after exposure to the predetermined electromagnetic radiation.

In some embodiments of the step 720, the third mask 300 is placed over the negative photoresist 702b as shown in FIG. 21. In some embodiments, the third mask 300 is vertically aligned with the negative photoresist 702b and the first substrate 701.

In some embodiments of the step 730, the negative photoresist 702b is exposed to the predetermined electromagnetic radiation (labeled as EMR and indicated by dashed arrows) through the third mask 300 as shown in FIG. 22. Different portions of the negative photoresist 702b receive different intensities of the predetermined electromagnetic radiation. The predetermined electromagnetic radiation is blocked by the third portion 100c, partially passes through the second portion 100b toward the fifth portion 702d, and passes through the first portion 100a toward the sixth portion 702e. In some embodiments, the second portion 100b surrounds the third portion 100c, and the first portion 100a surrounds the second portion 100b and the third portion 100c.

During the exposure of the negative photoresist 702b, the fourth portion 702c is shielded by the third mask 300, the fifth portion 702d is partially exposed to the predetermined electromagnetic radiation, and the sixth portion 702e is completely exposed to the predetermined electromagnetic radiation.

In some embodiments of the step 740, at least a portion of the negative photoresist 702b unexposed to the predetermined electromagnetic radiation is removed as shown in FIG. 23. In some embodiments, the unexposed fourth portion 702c is soluble in the predetermined developer and thus wholly removable. In some embodiments, the partially unexposed fifth portion 702d is partially soluble in the predetermined developer and thus partially removable. In some embodiments, the wholly exposed sixth portion 702e is insoluble in the predetermined developer and thus unremovable. As a result, the fourth portion 702c of the negative photoresist 702b is wholly removed, the fifth portion 702d is partially removed, and the sixth portion 702e is remained.

Figure 24:
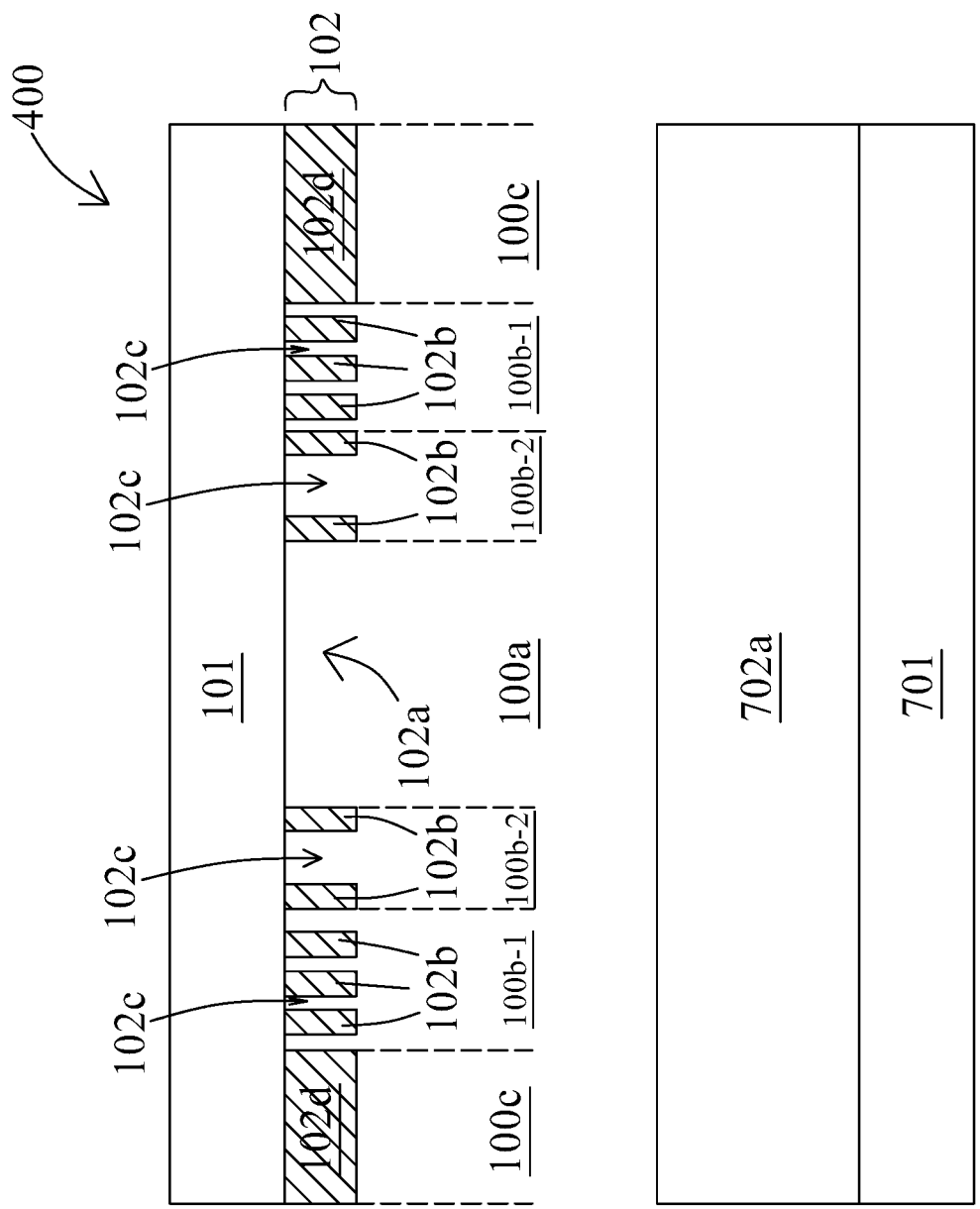
Figure 25:
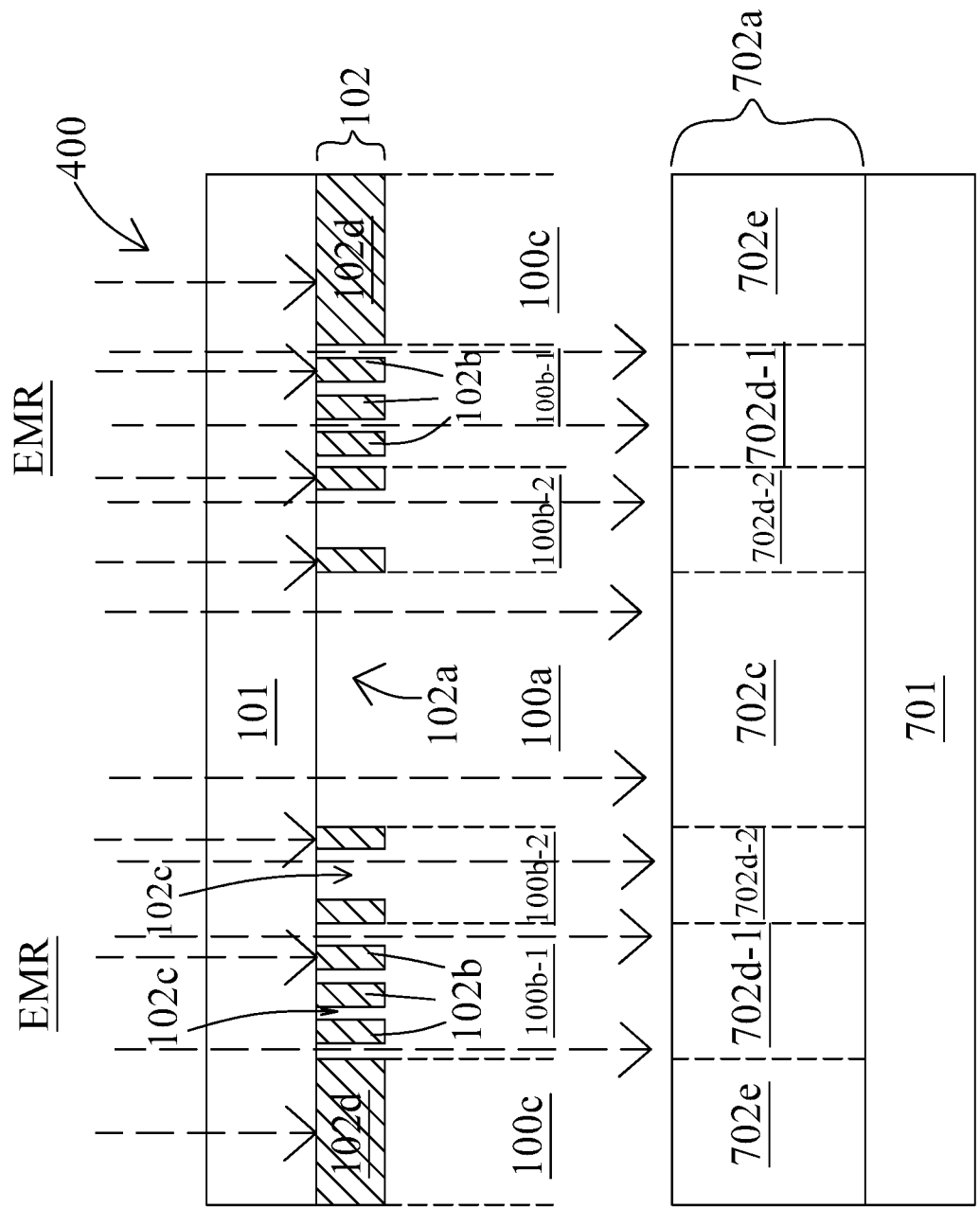
Figure 26:
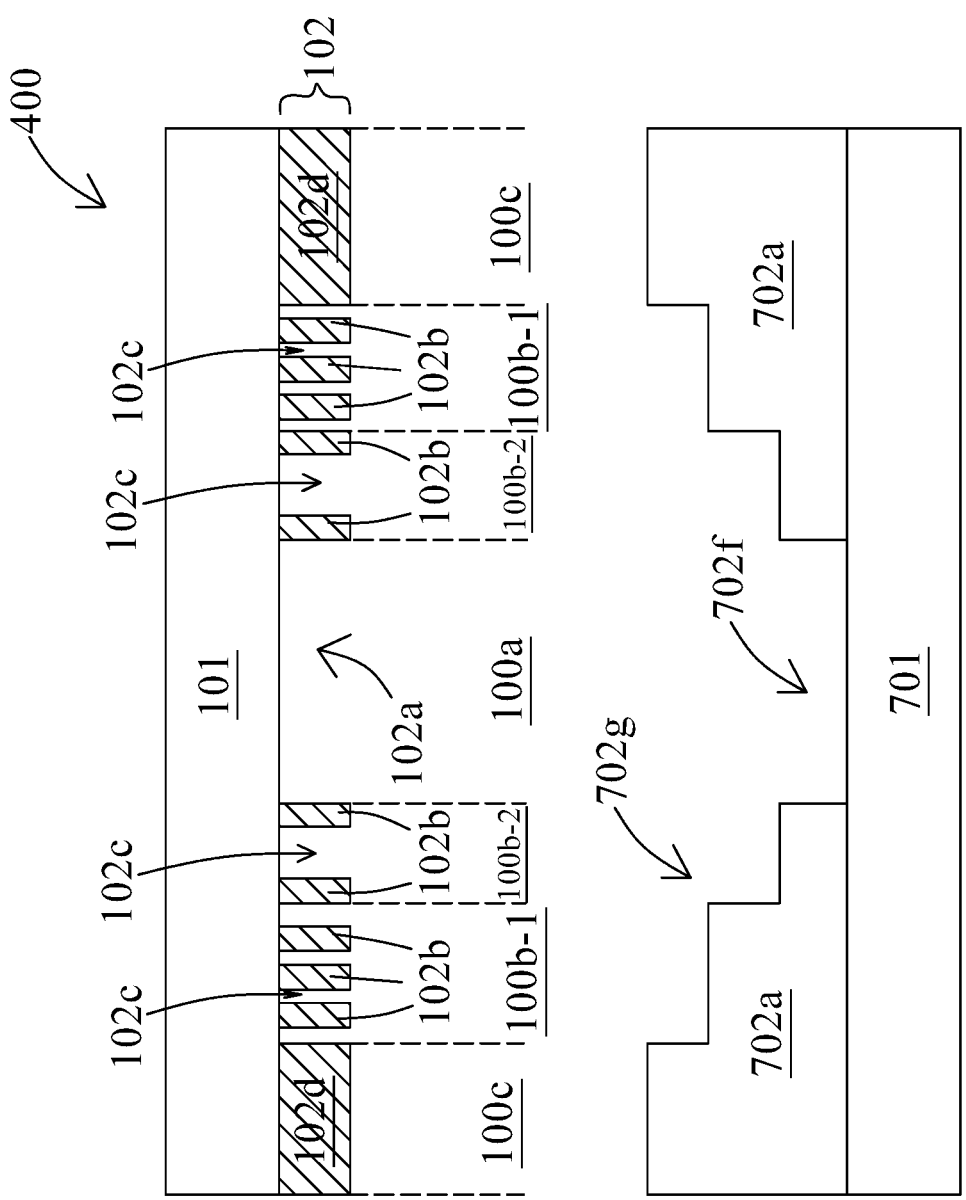

In some embodiments, the positive photoresist 702a is provided over the first substrate 701, and a fourth mask 400 is used for implementing the steps 710, 720, 730 and 740 of the method 700 as shown in FIGS. 24 to 26. In some embodiments, the fourth mask 400 is configured as described above or as shown in FIGS. 7 and 8.

In some embodiments of the step 720, the fourth mask 400 is placed over the positive photoresist 702a as shown in FIG. 24. In some embodiments, the fourth mask 400 is vertically aligned with the positive photoresist 702a and the first substrate 701.

In some embodiments of the step 730, the positive photoresist 702a is exposed to the predetermined electromagnetic radiation (labeled as EMR and indicated by dashed arrows) through the fourth mask 400 as shown in FIG. 25. Different portions of the positive photoresist 702a receive different intensities of the predetermined electromagnetic radiation.

In some embodiments, the positive photoresist 702a includes a fourth portion 702c, a fifth portion 702d and a sixth portion 702e. In some embodiments, during the exposure of the positive photoresist 702a to the predetermined electromagnetic radiation, the fourth portion 702c is completely exposed to the predetermined electromagnetic radiation, the fifth portion 702d is partially exposed to the predetermined electromagnetic radiation, and the sixth portion 702e is shielded by the shielding member 102d of the fourth mask 400.

In some embodiments, the second portion 100b of the shielding layer 102 includes a first section 100b-1 having the shielding portions 102b with a first density, and a second section 100b-2 having the shielding portions 102b with a second density. In some embodiments, the first density is substantially different from the second density. In some embodiments, the first section 100b-1 surrounds the second section 100b-2. In some embodiments, a fourth transmittance of the predetermined electromagnetic radiation through the first section 100b-1 is substantially less than a fifth transmittance of the predetermined electromagnetic radiation through the second section 100b-2.

In some embodiments, the fifth portion 702d further includes a third section 702d-1 and a fourth section 702d-2. In some embodiments, the third section 702d-1 receives a first intensity of the predetermined electromagnetic radiation and the fourth section 702d-2 receives a second intensity of the predetermined electromagnetic radiation. In some embodiments, the second intensity is substantially greater than the first intensity. As a result, the fourth section 702d-2 is exposed to more of the predetermined electromagnetic radiation than the third section 702d-1. Therefore, more material is removed from the fourth section 702d-2 than from the third section 702d-1.

In some embodiments of the step 740, at least a portion of the positive photoresist 702a exposed to the predetermined electromagnetic radiation is removed as shown in FIG. 26. The fourth portion 702c of the positive photoresist 702a is wholly removed, the fifth portion 702d is partially removed, and the sixth portion 702e is remained. More material is removed from the fourth section 702d-2 than from the third section 702d-1, and therefore several steps 702g are formed.

Figure 27:
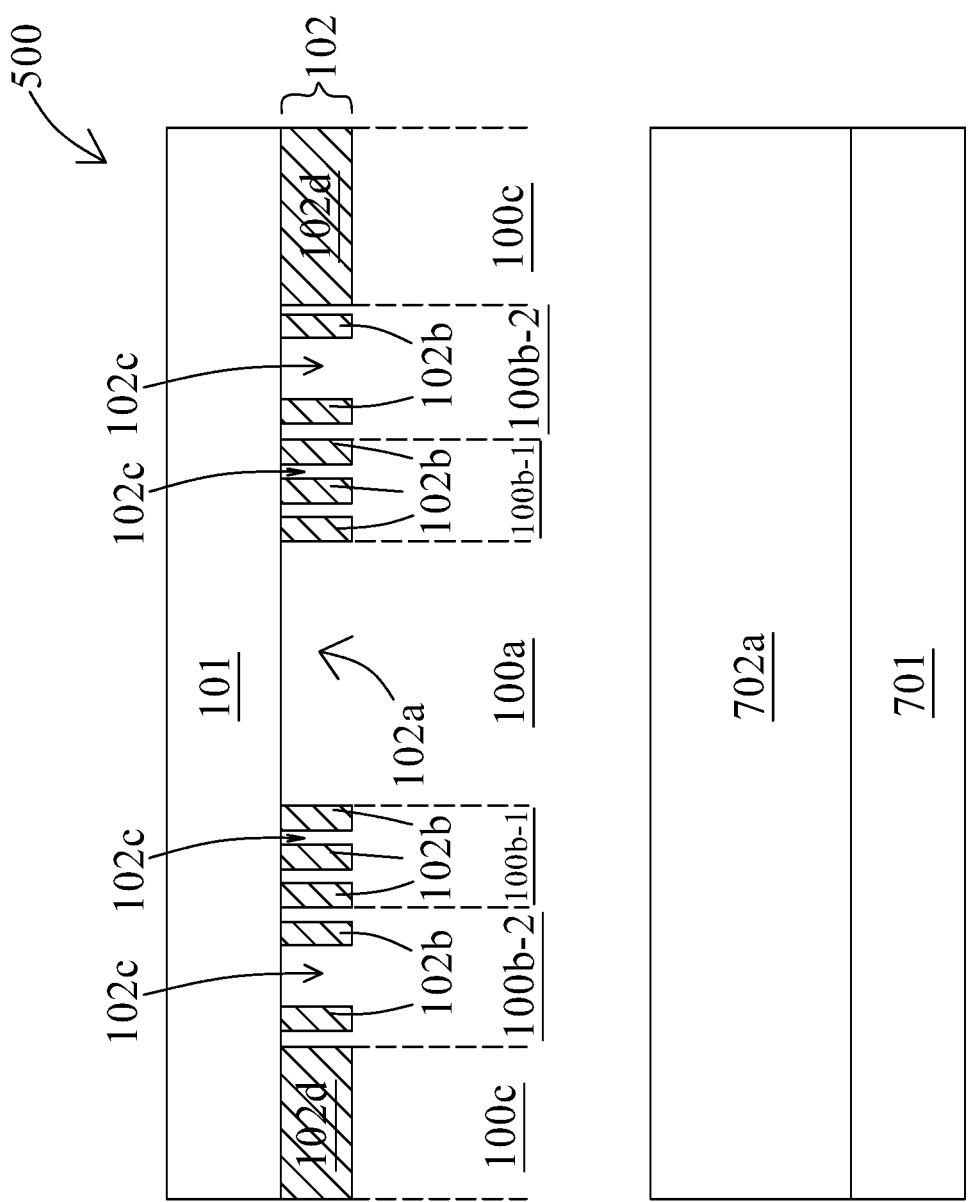
Figure 28:
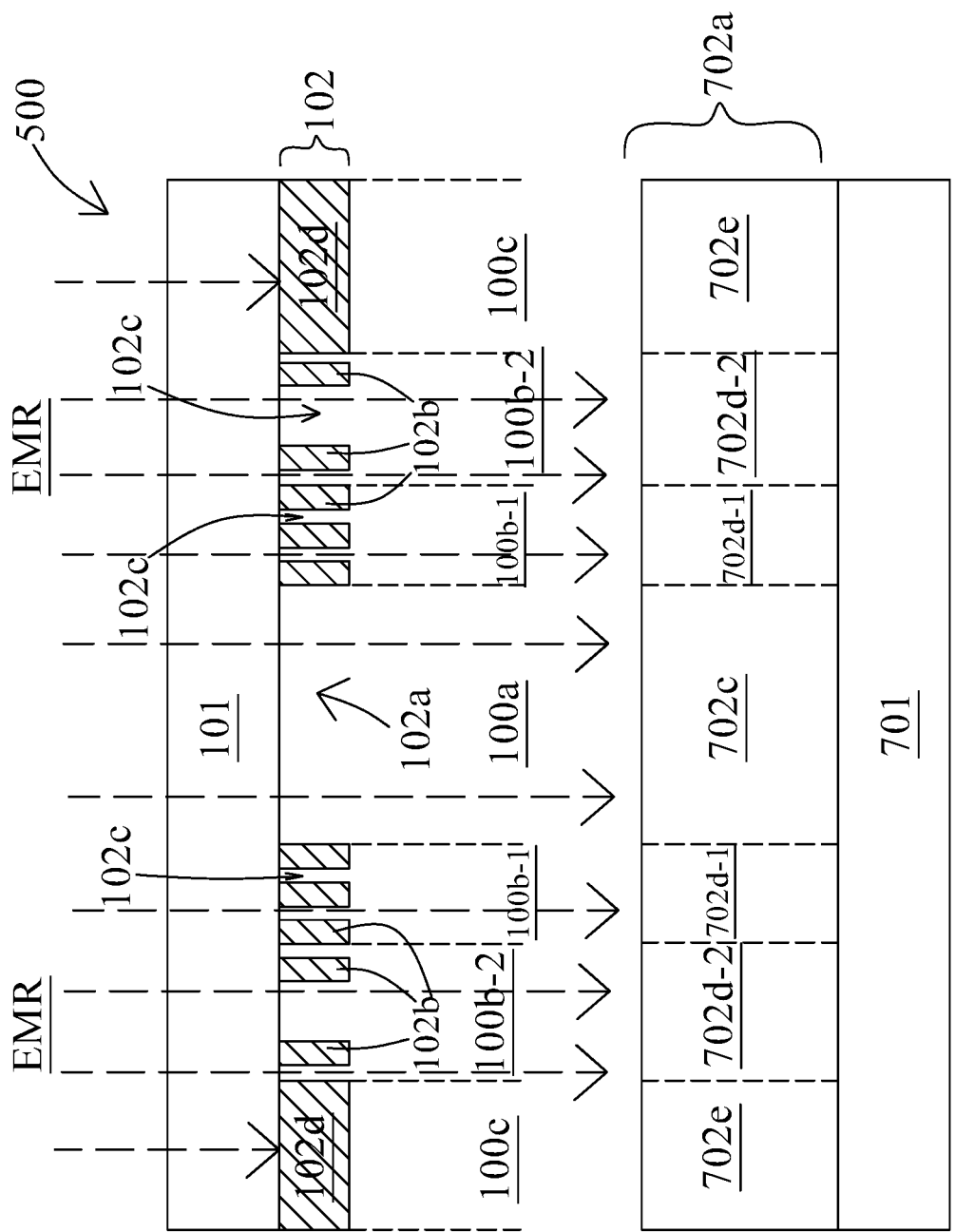
Figure 29:
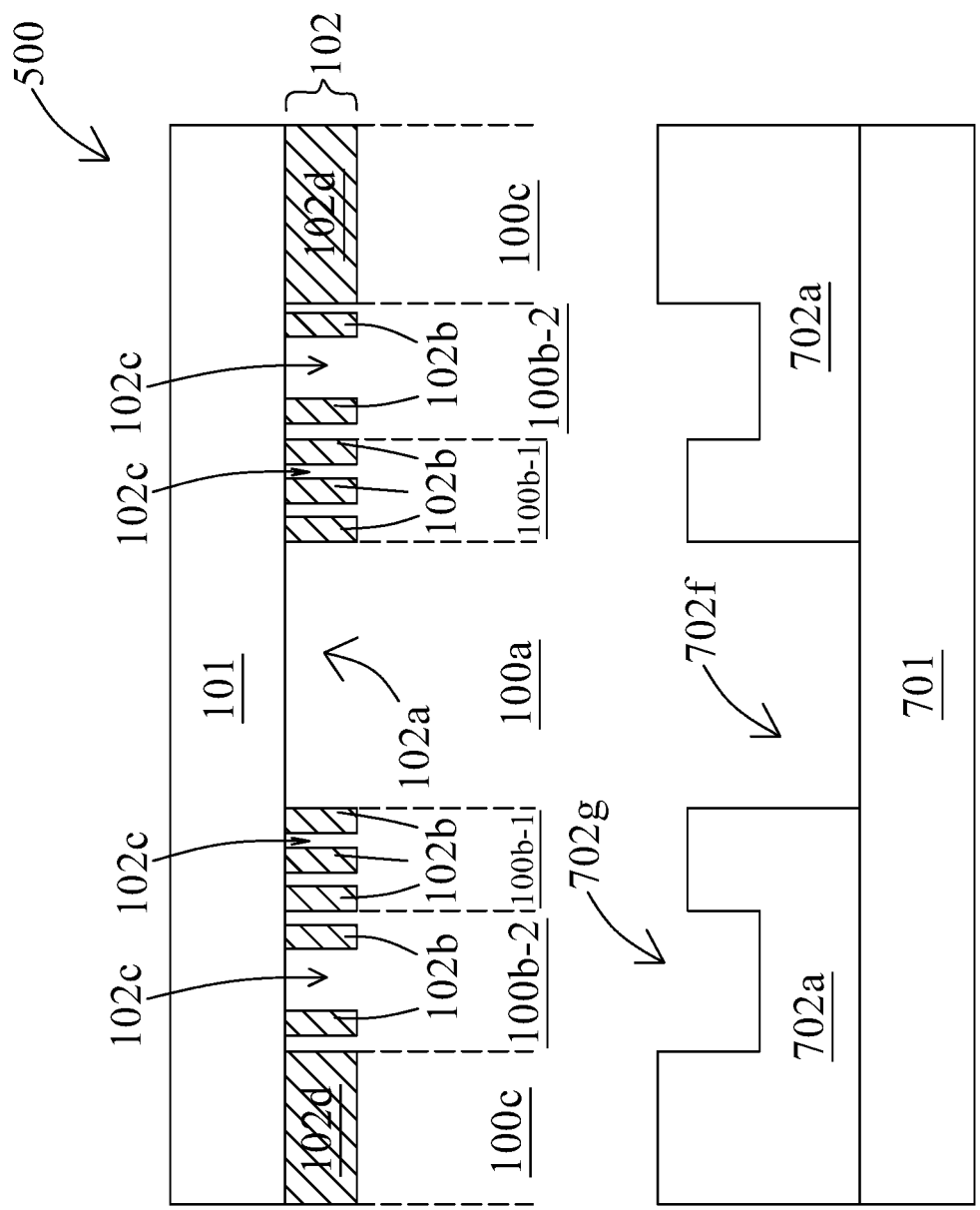

In some embodiments, the positive photoresist 702a is provided over the first substrate 701, and a fifth mask 500 is used for implementing the steps 710, 720, 730 and 740 of the method 700 as shown in FIGS. 27 to 29. In some embodiments, the fifth mask 500 is configured as described above or as shown in FIGS. 9 and 10.

In some embodiments of the step 720, the fifth mask 500 is placed over the positive photoresist 702a as shown in FIG. 27. In some embodiments, the fifth mask 500 is vertically aligned with the positive photoresist 702a and the first substrate 701.

In some embodiments of the step 730, the positive photoresist 702a is exposed to the predetermined electromagnetic radiation (labeled as EMR and indicated by dashed arrows) through the fifth mask 500 as shown in FIG. 28. Different portions of the positive photoresist 702a receive different intensities of the predetermined electromagnetic radiation.

In some embodiments, the positive photoresist 702a includes a fourth portion 702c, a fifth portion 702d and a sixth portion 702e. In some embodiments, during the exposure of the positive photoresist 702a to the predetermined electromagnetic radiation, the fourth portion 702c is completely exposed to the predetermined electromagnetic radiation, the fifth portion 702d is partially exposed to the predetermined electromagnetic radiation, and the sixth portion 702e is shielded by the shielding member 102d of the fifth mask 500.

In some embodiments, the second portion 100b of the shielding layer 102 includes a first section 100b-1 having the shielding portions 102b with a first density, and a second section 100b-2 having the shielding portions 102b with a second density. In some embodiments, the first density is substantially different from the second density. In some embodiments, the second section 100b-2 surrounds the first section 100b-1. In some embodiments, a fourth transmittance of the predetermined electromagnetic radiation through the first section 100b-1 is substantially less than a fifth transmittance of the predetermined electromagnetic radiation through the second section 100b-2.

In some embodiments, the fifth portion 702d further includes a third section 702d-1 and a fourth section 702d-2. In some embodiments, the third section 702d-1 receives a first intensity of the predetermined electromagnetic radiation and the fourth section 702d-2 receives a second intensity of the predetermined electromagnetic radiation. In some embodiments, the second intensity is substantially greater than the first intensity. As a result, the fourth section 702d-2 is exposed to more of the predetermined electromagnetic radiation than the third section 702d-1. Therefore, more material is removed from the fourth section 702d-2 than from the third section 702d-1.

In some embodiments of the step 740, at least a portion of the positive photoresist 702a exposed to the predetermined electromagnetic radiation is removed as shown in FIG. 29. The fourth portion 702c of the positive photoresist 702a is wholly removed, the fifth portion 702d is partially removed, and the sixth portion 702e is remained. More material is removed from the fourth section 702d-2 than from the third section 702d-1, and therefore several steps 702g are formed.

Figure 30:
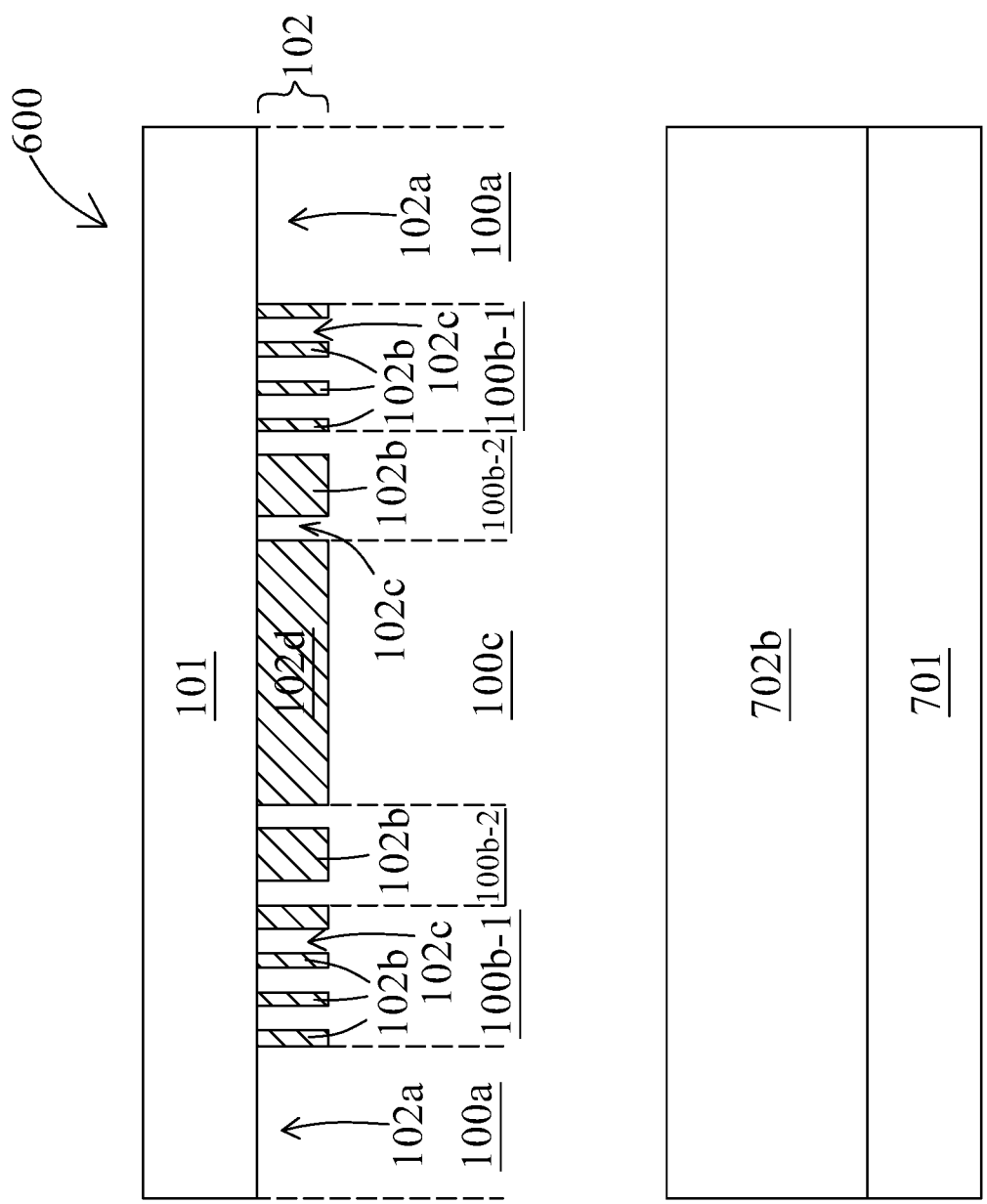
Figure 31:
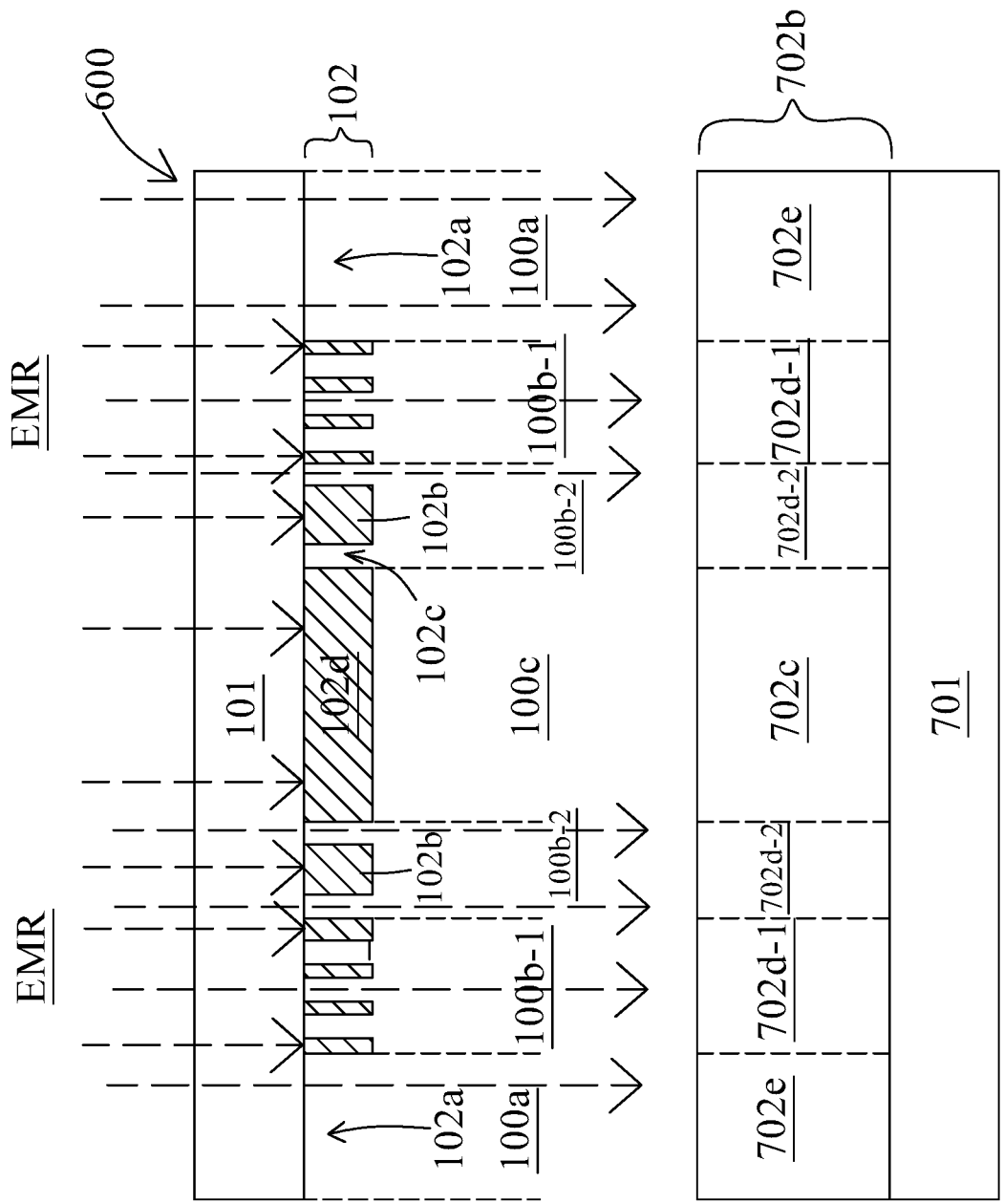
Figure 32:
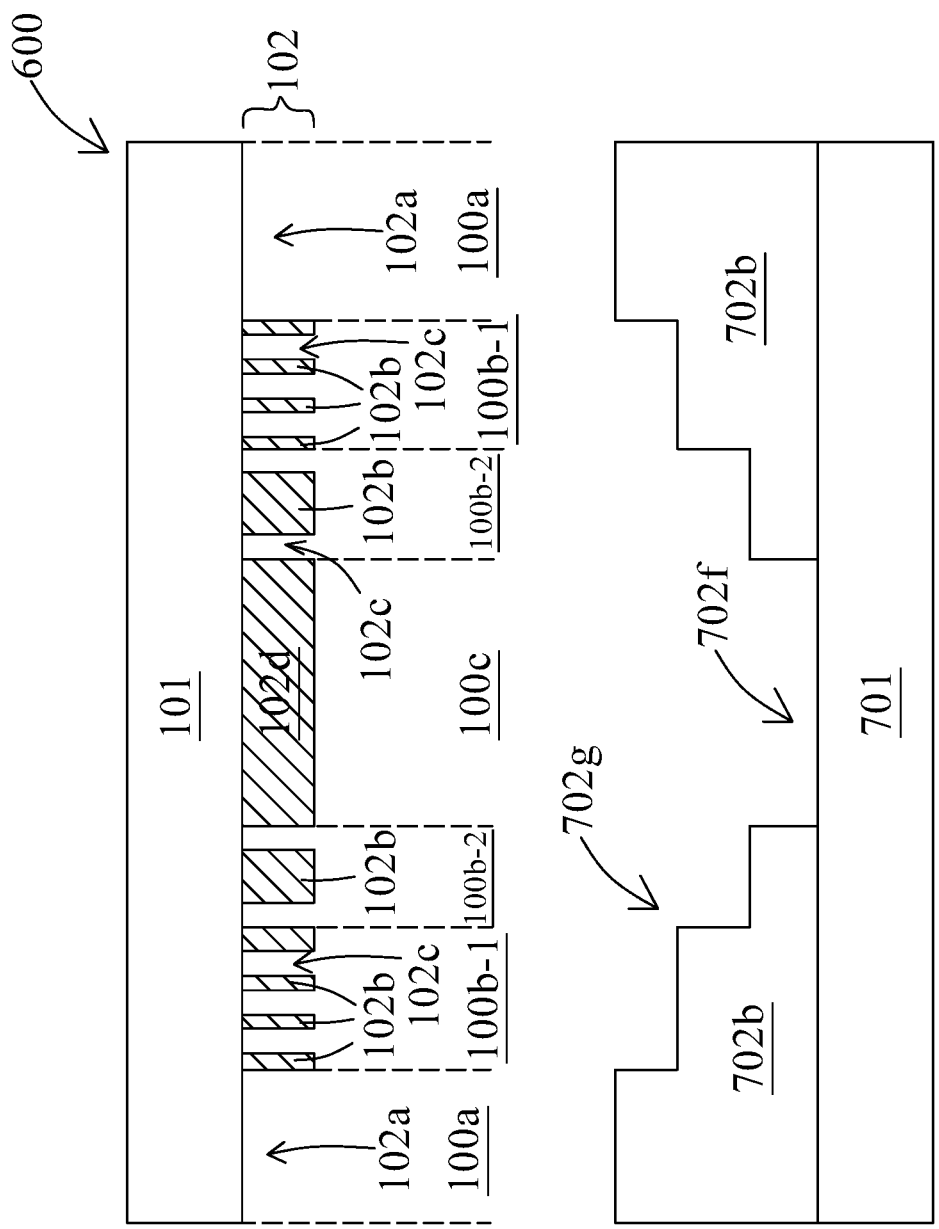

In some embodiments, the negative photoresist 702b is provided over the first substrate 701, and a sixth mask 600 is used for implementing the steps 710, 720, 730 and 740 of the method 700 as shown in FIGS. 30 to 32. In some embodiments, the sixth mask 600 is configured as described above or as shown in FIGS. 11 and 12.

In some embodiments of the step 720, the sixth mask 600 is placed over the negative photoresist 702b as shown in FIG. 30. In some embodiments, the sixth mask 600 is vertically aligned with the negative photoresist 702b and the first substrate 701.

In some embodiments of the step 730, the negative photoresist 702b is exposed to the predetermined electromagnetic radiation (labeled as EMR and indicated by dashed arrows) through the sixth mask 600 as shown in FIG. 31. Different portions of the negative photoresist 702b receive different intensities of the predetermined electromagnetic radiation. The predetermined electromagnetic radiation is blocked by the third portion 100c, partially passes through the second portion 100b toward the fifth portion 702d, and passes through the first portion 100a toward the sixth portion 702e. In some embodiments, the second portion 100b surrounds the third portion 100c, and the first portion 100a surrounds the second portion 100b and the third portion 100c.

In some embodiments, the negative photoresist 702b includes a fourth portion 702c, a fifth portion 702d and a sixth portion 702e. During the exposure of the negative photoresist 702b, the fourth portion 702c is shielded by the sixth mask 600, the fifth portion 702d is partially exposed to the predetermined electromagnetic radiation, and the sixth portion 702e is completely exposed to the predetermined electromagnetic radiation.

In some embodiments, the second portion 100b of the shielding layer 102 includes a first section 100b-1 having the shielding portions 102b with a first density, and a second section 100b-2 having the shielding portions 102b with a second density. In some embodiments, the first density is substantially different from the second density. In some embodiments, a fourth transmittance of the predetermined electromagnetic radiation through the first section 100b-1 is substantially greater than a fifth transmittance of the predetermined electromagnetic radiation through the second section 100b-2.

In some embodiments, the fifth portion 702d further includes a third section 702d-1 and a fourth section 702d-2. In some embodiments, the third section 702d-1 receives a first intensity of the predetermined electromagnetic radiation and the fourth section 702d-2 receives a second intensity of the predetermined electromagnetic radiation. In some embodiments, the first intensity is substantially greater than the second intensity. As a result, the third section 702d-1 is exposed to more of the predetermined electromagnetic radiation than the fourth section 702d-2. Therefore, more material is removed from the fourth section 702d-2 than from the third section 702d-1.

In some embodiments of the step 740, at least a portion of the negative photoresist 702b unexposed to the predetermined electromagnetic radiation is removed as shown in FIG. 32. In some embodiments, the unexposed fourth portion 702c is soluble in the predetermined developer and thus wholly removable. In some embodiments, the partially unexposed fifth portion 702d is partially soluble in the predetermined developer and thus partially removable. In some embodiments, the wholly exposed sixth portion 702e is insoluble in the predetermined developer and thus unremovable. As a result, the fourth portion 702c of the negative photoresist 702b is wholly removed, the fifth portion 702d is partially removed, and the sixth portion 702e is remained. More material is removed from the fourth section 702d-2 than from the third section 702d-1, and therefore several steps 702g are formed.

Although the present disclosure and its advantages have been described in detail, it should be understood that various changes, substitutions and alterations can be made herein without departing from the spirit and scope of the disclosure as defined by the appended claims. For example, many of the processes discussed above can be implemented through different methods, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
   providing a substrate and a photoresist over the substrate;
   placing a mask over the photoresist;
   exposing the photoresist to a predetermined electromagnetic radiation through the mask; and
   removing at least a portion of the photoresist exposed to the predetermined electromagnetic radiation,
   wherein the mask includes a first portion configured to totally allow the predetermined electromagnetic radiation passing through, a second portion configured to partially allow the predetermined electromagnetic radiation passing through, and a third portion configured to block the predetermined electromagnetic radiation, the second portion is disposed between the first portion and the third portion;

wherein the first portion of the mask includes an opening.

2. The method of claim 1, wherein the first portion of the mask has a first transmittance of the predetermined electromagnetic radiation, the second portion of the mask has a second transmittance of the predetermined electromagnetic radiation, and the first transmittance is substantially greater than the second transmittance.

3. The method of claim 2, wherein the third portion of the mask has a third transmittance of the predetermined electromagnetic radiation, and the first transmittance and the second transmittance are substantially greater than the third transmittance.

4. The method of claim 3, wherein the third transmittance is substantially equal to zero.

5. The method of claim 2, wherein the mask includes a seventh portion disposed between the first portion and the second portion or between the second portion and the third portion, and the seventh portion has a fourth transmittance of the predetermined radiation between the first transmittance and the second transmittance.

6. The method of claim 1, wherein the second portion of the mask includes a plurality of openings and a plurality of shielding portions, and one of the plurality of openings is disposed between two of the plurality of shielding portions.

7. The method of claim 1, wherein during exposing the photoresist, the photoresist includes a fourth portion, a fifth portion surrounding the fourth portion and a sixth portion surrounding the fourth portion and the fifth portion, the fourth portion is wholly removed, and the fifth portion is partially removed after the removal of at least the portion of the photoresist.

8. The method of claim 1, wherein the shape of photoresist includes a step feature after the removal of at least the portion of the photoresist.

9. The method of claim 1, wherein the predetermined electromagnetic radiation is ultraviolet (UV) radiation, visible light or infrared (IR) radiation.

10. The method of claim 1, wherein the photoresist is a positive photoresist soluble in a predetermined developer after the exposure of the photoresist to the predetermined electromagnetic radiation.

11. The method of claim 10, wherein during the exposure of the photoresist, the fourth portion is completely exposed to the predetermined electromagnetic radiation, the fifth portion is partially exposed to the predetermined electromagnetic radiation, and the sixth portion is shielded by the mask.

12. The method of claim 10, wherein the predetermined electromagnetic radiation passes through the first portion toward the fourth portion, partially passes through the second portion toward the fifth portion, and is blocked by the third portion.

13. The method of claim 10, wherein the second portion surrounds the first portion, and the third portion surrounds the first portion and the second portion.

14. The method of claim 1, wherein the photoresist is a negative photoresist insoluble in a predetermined developer after the exposure of the photoresist to the predetermined electromagnetic radiation, the photoresist includes a fourth portion, a fifth portion surrounding the fourth portion and a sixth portion surrounding the fourth portion and the fifth portion, the fourth portion is wholly removed, and the fifth portion is partially removed after the removal of at least the portion of the photoresist.

15. The method of claim 14, wherein during the exposure of the photoresist, the fourth portion is shielded by the mask, the fifth portion is partially exposed to the predetermined electromagnetic radiation, and the sixth portion is completely exposed to the predetermined electromagnetic radiation.

16. The method of claim 14, wherein the predetermined electromagnetic radiation is blocked by the third portion, partially passes through the second portion toward the fifth portion, and passes through the first portion toward the sixth portion.

17. The method of claim 14, wherein the second portion surrounds the third portion, and the first portion surrounds the second portion and the third portion.

* * * * *